(12) United States Patent
Park et al.

(10) Patent No.: US 11,870,283 B2
(45) Date of Patent: Jan. 9, 2024

(54) ENERGY STORAGE SYSTEM

(71) Applicant: LG ELECTRONICS INC., Seoul (KR)

(72) Inventors: Eunchul Park, Seoul (KR); Sungeun Bang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/645,271

(22) Filed: Dec. 20, 2021

(65) Prior Publication Data

US 2023/0113916 A1 Apr. 13, 2023

(30) Foreign Application Priority Data

Oct. 12, 2021 (KR) .......................... 10-2021-0135126

(51) Int. Cl.
*H02J 3/38* (2006.01)
*H01M 50/213* (2021.01)
(Continued)

(52) U.S. Cl.
CPC ........ *H02J 7/0029* (2013.01); *G01R 31/3842* (2019.01); *H01M 10/425* (2013.01);
(Continued)

(58) Field of Classification Search
CPC ........ H02J 7/0029; H02J 3/381; H02J 7/0013; H02J 7/0047; H02J 7/0063;
(Continued)

(56) References Cited

U.S. PATENT DOCUMENTS

2017/0301907 A1* 10/2017 Park .................... H01M 50/543
2019/0189382 A1* 6/2019 Holland ................. H01H 85/10
(Continued)

FOREIGN PATENT DOCUMENTS

EP          3730955         10/2020
JP       WO2018003203      10/2018
(Continued)

OTHER PUBLICATIONS

PCT International Application No. PCT/KR2021/020372, International Search Report dated Jul. 11, 2022, 3 pages.
(Continued)

*Primary Examiner* — Lincoln D Donovan
*Assistant Examiner* — Alex W Lam
(74) *Attorney, Agent, or Firm* — LEE, HONG, DEGERMAN, KANG & WAIMEY PC

(57) ABSTRACT

An energy storage system includes: a battery configured to at least store received electrical energy in a form of direct current, or output the stored electrical energy; a power conditioning system configured to convert an electrical characteristic to charge or discharge the battery; and a battery management system configured to monitor state information of the battery, wherein the battery includes a plurality of battery packs each including a respective plurality of battery cells, wherein the battery management system includes: battery pack circuit boards which are disposed in each of the plurality of battery packs, and configured to obtain state information of the plurality of battery cells included in each battery pack; and a main circuit board coupled to the battery pack circuit boards by a communication line, and configured to receive state information obtained by the battery pack circuit boards from each battery pack.

18 Claims, 25 Drawing Sheets

(51) Int. Cl.
*H01M 10/48* (2006.01)
*H01M 50/251* (2021.01)
*H01M 10/42* (2006.01)
*H02J 7/00* (2006.01)
*G01R 31/3842* (2019.01)

(52) U.S. Cl.
CPC ....... *H01M 10/482* (2013.01); *H01M 50/213* (2021.01); *H01M 50/251* (2021.01); *H02J 3/381* (2013.01); *H02J 7/0013* (2013.01); *H02J 7/0047* (2013.01); *H02J 7/0063* (2013.01); *H02J 7/007182* (2020.01); *H01M 2010/4271* (2013.01); *H01M 2220/10* (2013.01); *H02J 2300/24* (2020.01)

(58) Field of Classification Search
CPC ............ H02J 7/007182; H02J 2300/24; G01R 31/3842; H01M 10/425; H01M 10/482; H01M 50/213; H01M 50/251; H01M 2010/4271; H01M 2220/10
See application file for complete search history.

(56) References Cited

U.S. PATENT DOCUMENTS

2019/0237826 A1   8/2019   Ida et al.
2020/0203698 A1*  6/2020   Jin ..................... H01M 10/482
2021/0083505 A1*  3/2021   Beaston ................. H02J 9/06

FOREIGN PATENT DOCUMENTS

| KR | 1020060059680 | 6/2006 |
| KR | 10-1634933    | 7/2016 |
| KR | 10-1845703    | 4/2018 |
| KR | 1020180103212 | 9/2018 |
| KR | 1020200029701 | 3/2020 |
| KR | 10-2237845    | 4/2021 |

OTHER PUBLICATIONS

Korean Intellectual Property Office Application No. 10-2021-0135126, Office Action dated May 15, 2023, 4 pages.

* cited by examiner

|  | relay IN | relay OUT | state | Note |
|---|---|---|---|---|
| relay OFF | High | High | fault | relay problem - welding ? |
|  | High | Low | Normal |  |
| relay ON | High | High | Normal |  |
|  | High | Low | fault | relay problem - welding ? |
| relay OUT |  | > 500V | fault | HW interrupt fault |
|  |  | < 450V | release | HW stable state |

ENERGY STORAGE SYSTEM

CROSS-REFERENCE TO RELATED APPLICATION

Pursuant to 35 U.S.C. § 119(a), this application claims the benefit of earlier filing date and right of priority to Korean Patent Application No. 10-2021-0135126, filed on Oct. 12, 2021, the contents of which are incorporated herein by reference in its entirety.

BACKGROUND OF THE INVENTION

1. Field of the Invention

The present disclosure relates to an energy storage system, and more particularly, to a battery-based energy storage system and an operating method thereof.

2. Description of the Related Art

An energy storage system is a system that stores or charges external power, and outputs or discharges stored power to (e.g., an external entity). To this end, the energy storage system includes a battery, and a power conditioning system that is used for supplying power to the battery or outputting power from the battery.

Since the energy storage system has the possibility of accidents such as explosion, ignition, and gas emission, various technologies have been proposed to improve safety. For example, Korean Patent Publication No. 2006-0059680 discloses a circuit for protecting circuits and battery cells from short circuit and overvoltage, and Korean Patent Publication No. 2018-0103212 discloses a battery and a protection circuit adjacent to the battery.

Such a battery protection circuit performs a protection operation to guard against situations such as overvoltage and overcurrent, but there is a possibility that the protection operation fails because sensing or protection operation is not multiplexed. In addition, manual input from a user is required for restarting.

A momentary inrush current or surge may flow into an internal circuit from the battery when power is turned on, so that the circuit may be damaged or caused to malfunction. In addition, when power is turned on, safety problems such as a short circuit may occur by high voltage or overcurrent due to carelessness of an installer. In addition, when the power button is unintentionally pressed due to various causes, such as a user's carelessness or a child's curiosity, unnecessary energy loss may occur or various problems may occur when the operation is performed without recognizing the operating state.

Therefore, there is a need for a multiplexed protection technology that can secure product safety against various situations such as short circuit and overvoltage caused by uncontrollable external factors.

SUMMARY OF THE INVENTION

Embodiments of the present disclosure have been made in view of the above problems, and an object of an embodiment of the present disclosure is to provide an energy storage system having a structure in which a plurality of battery cells are stably disposed.

Another object of an embodiment of the present disclosure is to provide an energy storage system capable of protecting a control circuit from problems inside a battery pack.

Another object of an embodiment of the present disclosure is to provide an energy storage system including circuit boards designed to be compact and stable.

Another object of an embodiment of the present disclosure is to provide an energy storage system capable of significantly improving overall safety by providing multiple safety devices.

Another object of an embodiment of the present disclosure is to provide an energy storage system provided with a plurality of identical safety devices so as to safely perform safety control even when a problem occurs in any one of the plurality of identical safety devices.

Another object of an embodiment of the present disclosure is to provide an energy storage system capable of accurately determining whether a relay has failed.

Another object of an embodiment of the present disclosure is to provide an energy storage system having multiple means capable of immediately responding in hardware without a determination process in software when overvoltage or overcurrent occurs.

Another object of an embodiment of the present disclosure is to provide an energy storage system having an enhanced safety in power on/off.

In order to achieve the above object, the energy storage system according to embodiments of the present disclosure may include multiple safety devices to improve safety.

In order to achieve the above object, in the energy storage system according to embodiments of the present disclosure, a main circuit configuration may be separated to protect a control circuit from a problem inside the battery pack.

In order to achieve the above object, the energy storage system according to embodiments of the present disclosure may improve safety by providing a software safety device and a hardware safety device concurrently.

In order to achieve the above object, in the energy storage system according to embodiments of the present disclosure, the main circuit configuration may be separated to protect the control circuit from problems inside the battery pack.

In order to achieve the above object, the energy storage system according to embodiments of the present disclosure uses a multi-step control design, and can protect the battery management system from the instantaneous inrush current from the battery, surge, or the like, when power is turned on.

In order to achieve the above object, the energy storage system according to embodiments of the present disclosure may be turned off immediately when a dangerous situation occurs with a one-step control design, when power is turned off.

In accordance with an aspect of the present disclosure, an energy storage system includes: a battery configured to at least store received electrical energy in a form of direct current, or output the stored electrical energy; a power conditioning system configured to convert an electrical characteristic to charge or discharge the battery; and a battery management system configured to monitor state information of the battery, wherein the battery includes a plurality of battery packs each including a respective plurality of battery cells.

The battery management system includes: battery pack circuit boards which are disposed in each of the plurality of battery packs, and configured to obtain state information of the plurality of battery cells included in each battery pack; and a main circuit board coupled to the battery pack circuit boards by a communication line, and configured to receive state information obtained by the battery pack circuit boards from each battery pack.

The plurality of battery packs may be connected in series by a power line, wherein the power line may be coupled to the main circuit board.

The battery management system may include: a first relay disposed between a positive electrode of the battery and a positive electrode of the power conditioning system; a second relay disposed between a negative electrode of the battery and a negative electrode of the power conditioning system; a first voltage sensor configured to detect a voltage of a first node between the first relay and the power conditioning system; a second voltage sensor configured to detect a voltage of a second node between the first relay and the positive electrode of the battery; and a microcomputer configured to control the first relay and the second relay, based on the voltage of the first node detected by the first voltage sensor and the voltage of the second node detected by the second voltage sensor.

The first relay, the second relay, the first voltage sensor, the second voltage sensor, and the microcomputer may be mounted in the main circuit board.

The battery management system may further include: a first current sensor disposed between the positive electrode of the battery and the positive electrode of the power conditioning system; and a second current sensor disposed between the negative electrode of the battery and the negative electrode of the power conditioning system.

The first relay and the second relay may be turned off based on the voltage of the first node being greater than or equal to a reference value, and the first relay and the second relay may be turned on based on the voltage of the first node being less than the reference value.

The microcomputer may determine that the first relay has failed based on the voltage of the first node is high when the first relay is turned off, and determine that the first relay has failed based on the voltage of the first node being low when the first relay is turned on.

In accordance with an aspect of the present disclosure, an energy storage system may further include a voltage detector disposed between the first voltage sensor and the microcomputer, wherein an output of the voltage detector is coupled to an external interrupt pin of the microcomputer, and wherein based on a certain signal being input to the external interrupt pin, the first relay and the second relay are turned off.

In accordance with an aspect of the present disclosure, an energy storage system may further include: a circuit breaker disposed between the first relay and the positive electrode of the battery.

In accordance with an aspect of the present disclosure, an energy storage system may further include a fuse disposed between the second relay and the negative electrode of the battery.

In accordance with an aspect of the present disclosure, an energy storage system may further include a voltage detector disposed between the second voltage sensor and the microcomputer, wherein an output of the voltage detector is coupled to an external interrupt pin of the microcomputer unit, and wherein based on a certain signal being input to the external interrupt pin, the first relay and the second relay are turned off.

In accordance with an aspect of the present disclosure, an energy storage system may further include: a circuit breaker disposed between the first relay and the positive electrode of the battery; and a fuse disposed between the second relay and the negative electrode of the battery.

The microcomputer may control the first relay and the second relay, based on the voltage of the first node detected by the first voltage sensor, the voltage of the second node detected by the second voltage sensor, and voltage data received from the battery pack circuit boards.

The state information may include at least one of current data, voltage data, or temperature data.

The battery pack may further include battery modules to which the plurality of battery cells are connected in series and in parallel, wherein the battery modules are electrically connected to each other.

Two of the battery modules may be combined to form a battery module assembly, wherein the battery pack circuit boards are disposed at an upper side of the battery module assembly.

In accordance with an aspect of the present disclosure, an energy storage system may further include: a casing forming a space in which the plurality of battery packs are disposed, wherein the power conditioning system is disposed inside the casing.

In accordance with an aspect of the present disclosure, an energy storage system may further include: a power management system for controlling the power conditioning system, wherein the power management system is disposed in enclosures outside the casing.

In the enclosures, an auto transfer switch may be disposed in the enclosures, wherein the auto transfer switch is coupled to a grid power supply and a photovoltaic power supply, and is switchable so that, when a power outage occurs in a grid, electric energy produced from the photovoltaic power supply or stored in the battery is supplied to a certain load.

The power management system may be coupled to the grid power supply and the photovoltaic power supply, and configured to control the electric energy produced by the photovoltaic power supply or stored in the battery to be supplied to the certain load based on the power outage occurring in the grid.

BRIEF DESCRIPTION OF THE DRAWINGS

The above and other objects, features and advantages of the present disclosure will be more apparent from the following detailed description in conjunction with the accompanying drawings, in which.

DETAILED DESCRIPTION OF THE PREFERRED EMBODIMENTS

Figure 1A:
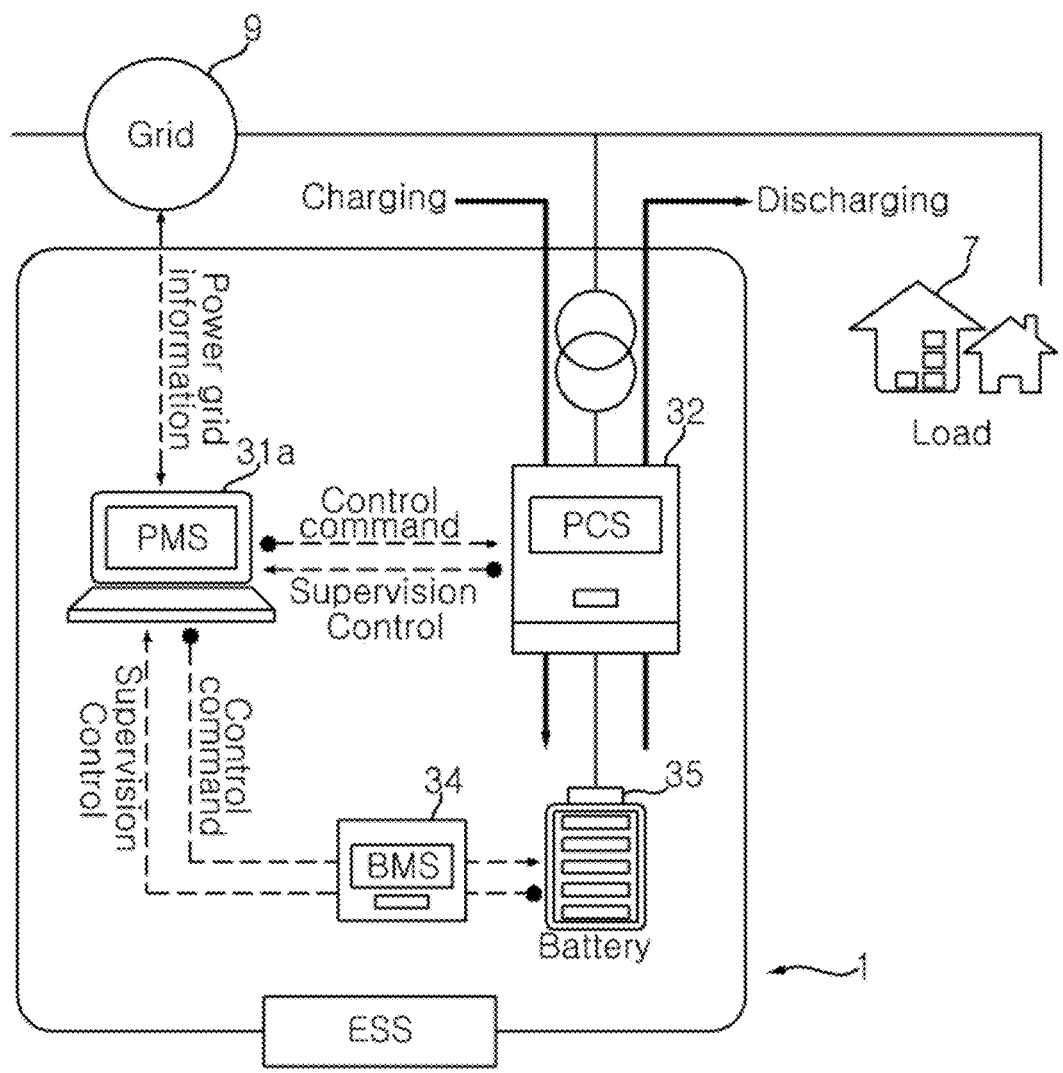
FIGS. 1A and 1B are conceptual diagrams of an energy supply system including an energy storage system according to an embodiment of the present disclosure.

Hereinafter, embodiments of the present disclosure will be described in detail with reference to the accompanying drawings. However, it is understood that the present disclosure is not limited to these embodiments and may be modified in various forms.

In the drawings, in order to clearly and briefly describe embodiments of the present disclosure, the illustration of parts irrelevant to the description is omitted, and the same reference numerals are used for the same or extremely similar parts throughout the specification.

Hereinafter, the suffixes "module" and "unit" of elements herein are used for convenience of description and thus may be used interchangeably and do not have any distinguishable meanings or functions. Thus, the terms "module" and "unit" may be interchangeably used.

It will be understood that, although the terms "first", "second", etc. may be used herein to describe various elements, these elements should not be limited by these terms. These terms are only used to distinguish one element from another element.

The labels top U, bottom D, left Le, right Ri, front F, and rear R used in the drawings are used to describe a battery pack and an energy storage system including the battery pack, and may be set differently according to standard.

The labels indicating height direction (h+, h−), length direction (l+, l−), and width direction (w+, w−) of the battery module used in FIGS. 10 to 13 are used to describe the battery module, and may be set differently according to standard.

Figure 1B:
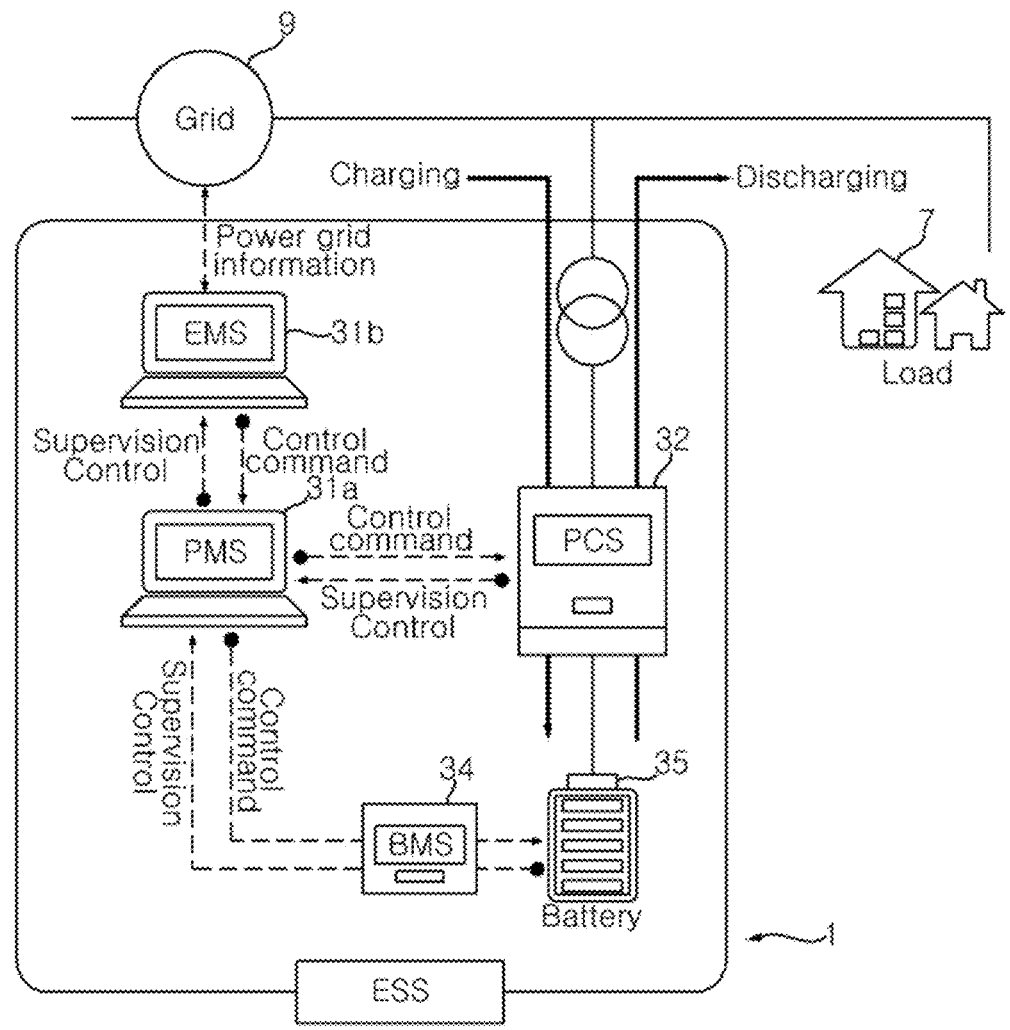

FIGS. 1A and 1B are conceptual diagrams of an energy supply system including an energy storage system according to an embodiment of the present disclosure.

Referring to FIGS. 1A and 1B, the energy supply system includes a battery-based (see, e.g., battery 35) energy storage system 1 in which electrical energy is stored, a load 7 that is a power demander (or consumer), and a grid 9 provided as an external power supply source.

The energy storage system 1 includes a battery 35 that stores (charges) the electric energy received from the grid 9, or the like in the form of direct current (DC) and/or outputs (discharges) the stored electric energy to the grid 9, or the like, a power conditioning system (PCS_32 for converting electrical characteristics (e.g. AC/DC interconversion, frequency, voltage) for charging or discharging the battery 35, and a battery management system 34 (BMS) that monitors and manages information (or parameters) such as current, voltage, and temperature of the battery 35.

The grid 9 may include a power generation facility for generating electric power, a transmission line, and the like. The load 7 may include a home appliance such as a refrigerator, a washing machine, an air conditioner, a TV, a robot cleaner, and a robot, a mobile electronic device such as a vehicle and a drone, and the like, as a consumer that consumes power.

The energy storage system 1 may store power from outside the system 1 in the battery 35 and then output power outside the system 1. For example, the energy storage system 1 may receive DC power or AC power from outside the system 1, store it in the battery 35, and then output the DC power or AC power to outside the system 1.

Since the battery 35 mainly stores DC power, the energy storage system 1 may receive DC power or convert the received AC power to DC power and store it in the battery 35, and may convert the DC power stored in the battery 35, and may supply the converted power to the grid 9 or the load 7.

The power conditioning system 32 in the energy storage system 1 may perform power conversion and voltage-charge the battery 35, or may supply the DC power stored in the battery 35 to the grid 9 or the load 7.

The energy storage system 1 may charge the battery 35 based on power supplied from the system and discharge the battery 35 when necessary. For example, the electric energy stored in the battery 35 may be supplied to the load 7 in an emergency such as a power outage, or at a time, date, or season when the electric energy supplied from the grid 9 is expensive.

The energy storage system 1 has the advantage of being able to improve the safety and convenience of new renewable energy generation by storing electric energy generated from a new renewable energy source such as sunlight, and to be used as an emergency power source. In addition, when the energy storage system 1 is used, it is possible to perform load leveling for a load having large fluctuations in (or over) time and season, and to save energy consumption and cost.

The battery management system 34 may measure the temperature, current, voltage, state of charge, and the like of the battery 35, and monitor the state of the battery 35. In addition, the battery management system 34 may control and manage the operating environment of the battery 35 to be optimized based on the state information of the battery 35.

The energy storage system 1 may include a power management system 31a (PMS) that controls the power conditioning system 32.

The power management system 31a may perform a function of monitoring and controlling the states of the battery 35 and the power conditioning system 32. The power management system 31a may be a controller that controls the overall operation of the energy storage system 1.

The power conditioning system 32 may control power distribution of the battery 35 according to a control command of the power management system 31a. The power conditioning system 32 may convert power according to the grid 9, a power generation means such as photovoltaic light, and the connection state of the battery 35 and the load 7.

The power management system 31a may receive state information of the battery 35 from the battery management system 34. A control command may be transmitted to the power conditioning system 32 and the battery management system 34.

The power management system 31a may include a communication means such as a Wi-Fi communication module, and a memory. Various information necessary for the operation of the energy storage system 1 may be stored in the memory. In some embodiments, the power management system 31a may include a plurality of switches and control a power supply path.

The power management system 31a and/or the battery management system 34 may calculate a state of charge (SOC) of the battery 35 using various well-known SOC calculation methods such as a coulomb counting method and a method of calculating a SOC based on an open circuit voltage (OCV). The battery 35 may overheat and irreversibly operate when the state of charge exceeds a maximum state of charge. Similarly, when the state of charge is less than or equal to the minimum state of charge, the battery may deteriorate and become unrecoverable. The power management system 31a and/or the battery management system 34 may monitor the internal temperature, the state of charge of the battery 35, and the like in real-time to control an optimal usage area and maximum input/output power.

The power management system 31a may operate under the control of an energy management system (EMS) 31b, which is an upper controller. The power management system 31a may control the energy storage system 1 by receiving a command from the energy management system 31b, and may transmit the state of the energy storage system 1 to the energy management system 31b. The energy management system 31b may be provided in the energy storage system 1 or may be provided in (or at) an upper system of the energy storage system 1.

The energy management system 31b may receive information such as charge information, power usage, and environmental information, and may control the energy storage system 1 according to the energy production, storage, and consumption patterns of user. The energy management system 31b may be provided as an operating system for monitoring and controlling the power management system 31a.

The controller for controlling the overall operation of the energy storage system 1 may include the power management system 31a and/or the energy management system 31b. In some embodiments, one of the power management system 31a or the energy management system 31b may also perform another function(s). In addition, the power management system 31a and the energy management system 31b may be integrated into one controller to be integrally provided.

The installation capacity of the energy storage system 1 varies according to the customer's installation condition, and a plurality of power conditioning systems 32 and batteries 35 may be connected (or coupled) to expand according to a required capacity.

The energy storage system 1 may be connected to at least one generating plant (see generating plant 3 of FIG. 2) separately from the grid 9. A generating plant 3 may include a wind generating plant that outputs DC power, a hydroelectric generating plant that outputs DC power using hydroelectric power, a tidal generating plant that outputs DC power using tidal power, thermal generating plant that outputs DC power using heat such as geothermal heat, or the like. Hereinafter, for convenience of description, the generating plant 3 will be primarily described with reference to a photovoltaic plant (or generator).

Figure 2:
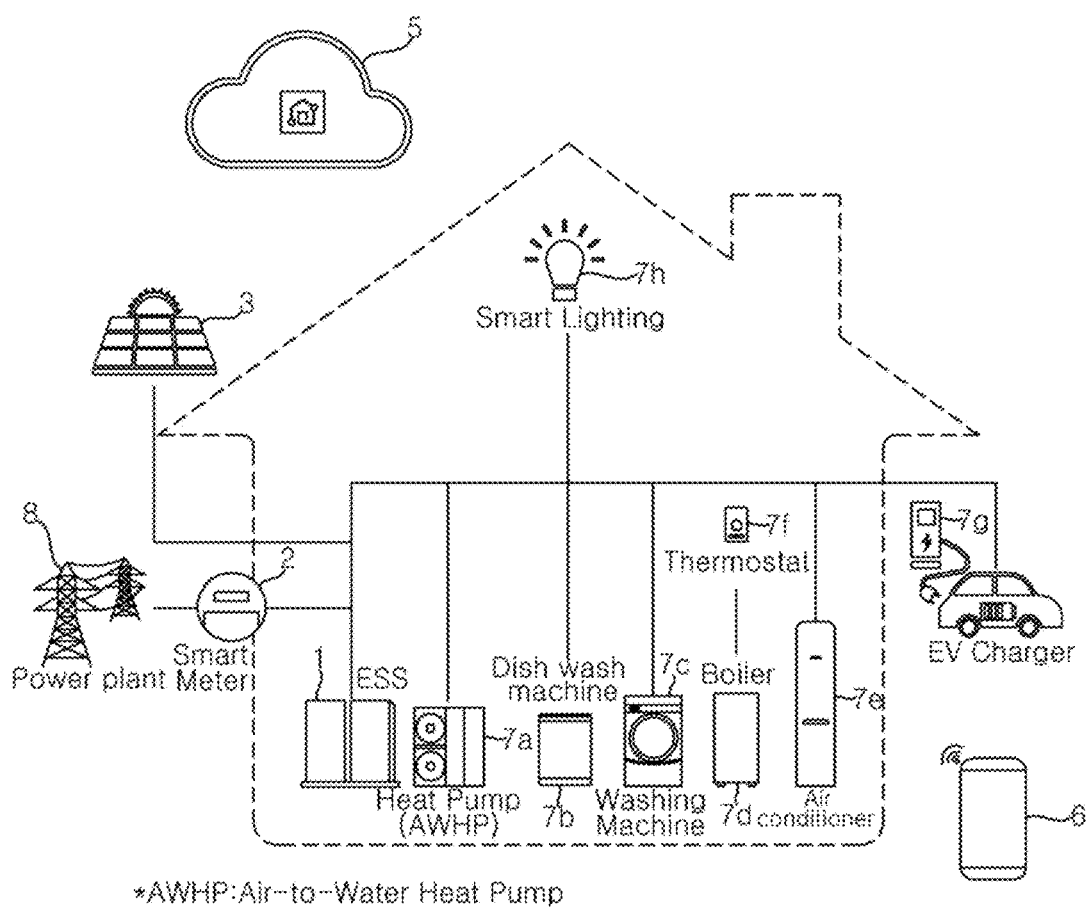
FIG. 2 is a conceptual diagram of a home energy service system including an energy storage system according to an embodiment of the present disclosure.

FIG. 2 is a conceptual diagram of a home energy service system including an energy storage system according to an embodiment of the present disclosure.

The home energy service system according to an embodiment of the present disclosure may include the energy storage system 1, and may be configured as a cloud-based (see, e.g., cloud 5) intelligent energy service platform for integrated energy service management.

Referring to FIG. 2, the home energy service system is mainly implemented in a home, and may manage the supply, consumption, and storage of energy (power) in the home.

The energy storage system 1 may be connected to a grid 9 such as a power plant 8, a generating plant such as a photovoltaic generator 3, a plurality of loads 7a to 7g, and sensors (not shown) to configure a home energy service system.

The loads 7a to 7g may be a heat pump 7a, a dishwasher 7b, a washing machine 7c, a boiler 7d, an air conditioner 7e, a thermostat 7f, an electric vehicle (EV) charger 7g, a smart lighting 7h, or the like.

The home energy service system may include other loads in addition to the loads (e.g., smart devices) illustrated in FIG. 2. For example, the home energy service system may include several lights in addition to the smart lighting 7h having one or more communication modules. In addition, the home energy service system may include a home appliance that does not include a communication module.

Some of the loads 7a to 7g are set as essential loads, so that power may be supplied from the energy storage system 1 when a power outage occurs. For example, a refrigerator and at least some lighting devices may be set as essential loads that require backup in case of power failure.

The energy storage system 1 can communicate with the devices 7a to 7g, and the sensors through a short-range wireless communication module. For example, the short-range wireless communication module may be at least one of Bluetooth, Wi-Fi, or Zigbee. In addition, the energy storage system 1, the devices 7a to 7g, and the sensors may be connected to an Internet network.

The energy management system 31b may communicate with the energy storage system 1, the devices 7a to 7g, the sensors, and the cloud 5 through an Internet network, and short-range wireless communication.

The energy management system 31b and/or the cloud 5 may transmit information received from the energy storage device 1, the devices 7a to 7g, and sensors and information determined using the received information to a terminal 6. The terminal 6 may be implemented as a smart phone, a PC, a notebook computer, a tablet PC, or the like. In some embodiments, an application for controlling the operation of the home energy service system may be installed and executed in (or at) the terminal 6.

The home energy service system may include a meter 2. The meter 2 may be provided between the power grid 9 such as the power plant 8 and the energy storage system 1. The meter 2 may measure the amount of power supplied to the home from the power plant 8 and consumed. In addition, the meter 2 may be provided inside the energy storage system 1. The meter 2 may measure the amount of power discharged from the energy storage system 1. The amount of power discharged from the energy storage system 1 may include the amount of power supplied (sold) from the energy storage system 1 to the power grid 9, and the amount of power supplied from the energy storage system 1 to the devices 7a to 7g.

The energy storage system 1 may store the power supplied from the photovoltaic generator 3 and/or the power plant 8, or the residual power remaining after the supplied power is consumed.

The meter 2 may be implemented using a smart meter. The smart meter may include a communication module for transmitting information related to power usage to the cloud 5 and/or the energy management system 31b.

Figure 3A:
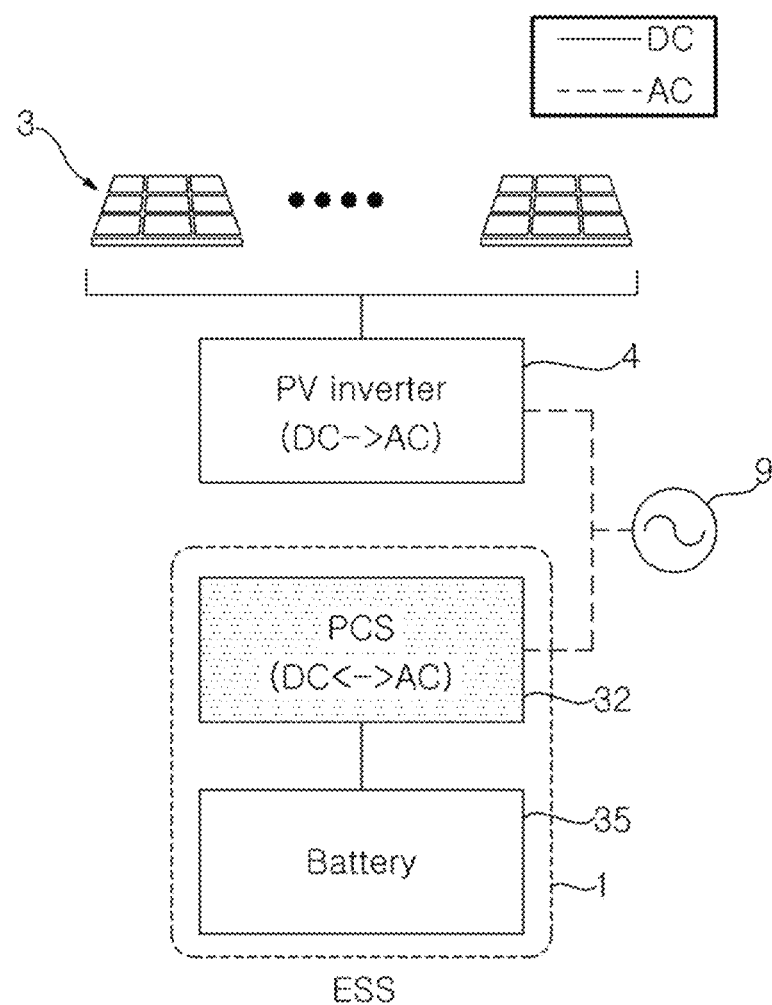
FIGS. 3A and 3B are diagrams illustrating an energy storage system installation type according to an embodiment of the present disclosure.
Figure 3B:
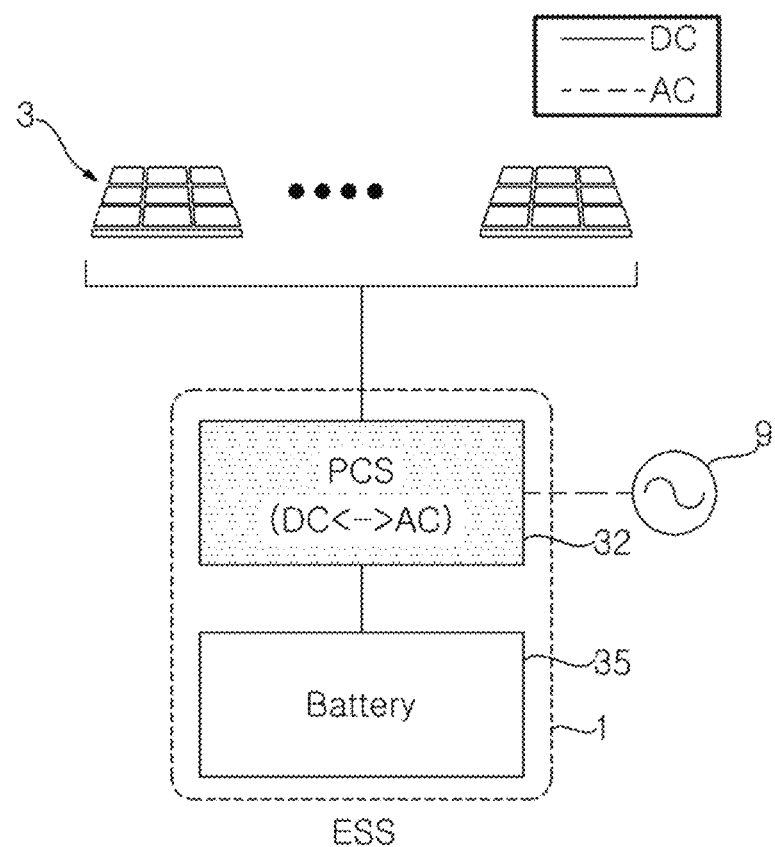

FIGS. 3A and 3B are diagrams illustrating an energy storage system installation type according to an embodiment of the present disclosure.

The home energy storage system 1 may be divided into (or categorized as) an AC-coupled energy storage system (ESS) (see FIG. 3A) and a DC-coupled ESS (see FIG. 3B) according to an installation type.

The photovoltaic plant includes a photovoltaic panel 3. Depending on the type of photovoltaic installation, the photovoltaic plant may include a photovoltaic panel 3 and a photovoltaic (PV) inverter 4 that converts DC power supplied from the photovoltaic panel 3 into AC power (see FIG. 3A). Thus, it is possible to implement the system more economically, as the energy storage system 1 independent of the existing grid 9 can be used.

In addition, according to an embodiment, the power conditioning system 32 of the energy storage system 1 and the PV inverter 4 may be implemented as an integrated power conversion device (see FIG. 3B). In this case, the DC power output from the photovoltaic panel 3 is input to the power conditioning system 32. The DC power may be transmitted to and stored in the battery 35. In addition, the power conditioning system 32 may convert DC power into AC power and supply the converted power to the grid 9. Accordingly, a more efficient system implementation can be achieved.

Figure 4:
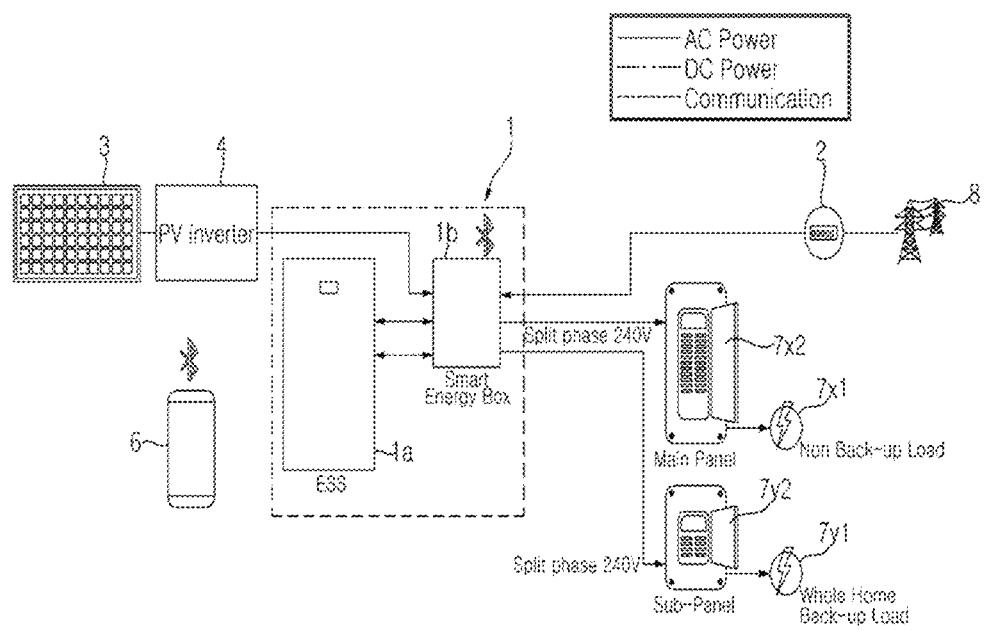
FIG. 4 is a conceptual diagram of a home energy service system including an energy storage system according to an embodiment of the present disclosure.

FIG. 4 is a conceptual diagram of a home energy service system including an energy storage system according to an embodiment of the present disclosure.

Referring to FIG. 4, the energy storage system 1 may be connected to the grid 9 such as the power plant 8, the power plant such as the photovoltaic generator 3, and a plurality of loads 7x1 and 7y1.

Electrical energy generated by the photovoltaic generator 3 may be converted in the PV inverter 4 and supplied to the grid 9, the energy storage system 1, and the loads 7x1 and 7y1. As described with reference to FIGS. 3A and 3B, according to the type of installation, the electrical energy generated by the photovoltaic generator 3 may be converted in the energy storage system 1, and supplied to the grid 9, the energy storage system 1, and the loads 7x1, 7y1.

The energy storage system 1 is provided with one or more wireless communication modules, and may communicate with the terminal 6. The user may monitor and control the state of the energy storage system 1 and the home energy service system through the terminal 6. In addition, the home energy service system may provide a cloud-based (see, e.g., cloud 5) service. The user may communicate with the cloud 5 through the terminal 6 regardless of location (e.g., of the user) and monitor and control the state of the home energy service system.

Figure 5:
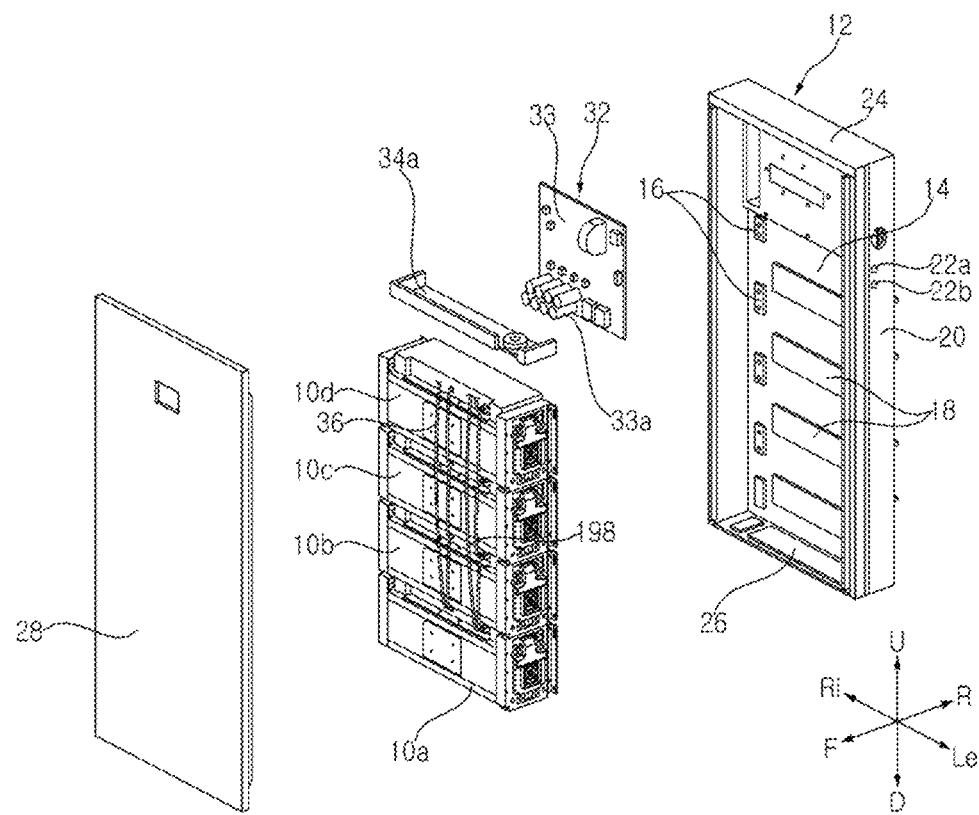
FIG. 5 is an exploded perspective view of an energy storage system including a plurality of battery packs according to an embodiment of the present disclosure.

According to an embodiment of the present disclosure, the above-described battery 35, the battery management system 34, and the power conditioning system 32 may be disposed inside a casing 12 (see, e.g., FIG. 5). Since the battery 35, the battery management system 34, and the power conditioning system 32 integrated in the casing 12 can store and convert power, they may be referred to as an all-in-one energy storage system 1a.

In addition, in separate enclosures 1b outside the casing 12, a configuration for power distribution such as a power management system 31a, an auto transfer switch (ATS), a smart meter, and a switch, and a communication module for communication with the terminal 6, the cloud 5, and the like may be disposed. A configuration in which configurations related to power distribution and management are integrated in one enclosure may be referred to as a smart energy box 1b.

The above-described power management system 31a may be received (or disposed) in the smart energy box 1b. A controller for controlling the overall power supply connection of the energy storage system 1 may be disposed in the smart energy box 1b. The controller may be the above mentioned power management system 31a.

In addition, switches are received (or disposed) in the smart energy box 1b to control the connection state of the connected grid power source 8, 9, the photovoltaic generator 3, the battery 35 of all-in-one energy storage system 1a, and loads 7x1, 7y1. The loads 7x1, 7y1 may be connected to the smart energy box 1b through the load panel 7x2, 7y2.

The smart energy box 1b is connected to the grid power source 8, 9 and the photovoltaic generator 3. In addition, when a power failure occurs in the system 8, 9, the auto transfer switch (ATS), which may be disposed in the smart energy box 1b, is switched so that the electric energy which is produced by the photovoltaic generator 3 or stored in the battery 35 is supplied to a certain load 7y1.

Alternatively, the power management system 31a may perform an auto transfer switch ATS function. For example, when a power failure occurs in the system 8, 9, the power management system 31a may control a switch such as a relay so that the electrical energy that is produced by the photovoltaic generator 3 or stored in the battery 35 is transmitted to a certain load 7y1.

A current sensor, a smart meter, or the like may be disposed in each current supply path. Electric energy of the electricity produced through the energy storage system 1 and the photovoltaic generator 3 may be measured and managed by a smart meter (or at least a current sensor).

The energy storage system 1 according to an embodiment of the present disclosure includes at least an all-in-one energy storage system 1a. In addition, the energy storage system 1 according to an embodiment of the present disclosure includes the all-in-one energy storage system 1a and the smart energy box 1b, thereby providing an integrated service that can simply and efficiently perform storage, supply, distribution, communication, and control of power.

The energy storage system 1 according to an embodiment of the present disclosure may operate in a plurality of operation modes. In a PV self consumption mode, photovoltaic generation power is first used in the load, and the remaining power is stored in the energy storage system 1. For example, when more power is generated in the photovoltaic generator 3 than the amount of power used by the loads 7x1 and 7y1 during the day, the battery 35 is charged.

In a charge/discharge mode based on a rate system, four time zones may be set and input, the battery 35 may be discharged during a time period when the electric rate is expensive, and the battery 35 may be charged during a time period when the electric rate is cheap. The energy storage system 1 may help a user to save electric rate (or electricity costs) in the charge/discharge mode based on a rate system.

A backup-only mode is a mode for emergency situations such as power outages, and can operate, with the highest priority, such that when a typhoon is expected (or predicted) by a weather forecast or there is a possibility of other power outages, the battery 35 may be charged up to a maximum and supplied to an essential load 7y1 in an emergency.

The energy storage system 1 of the present disclosure will be described with reference to FIGS. 5 to 7. More particularly, detailed structures of the all-in-one energy storage system 1a are disclosed.

Figure 6:
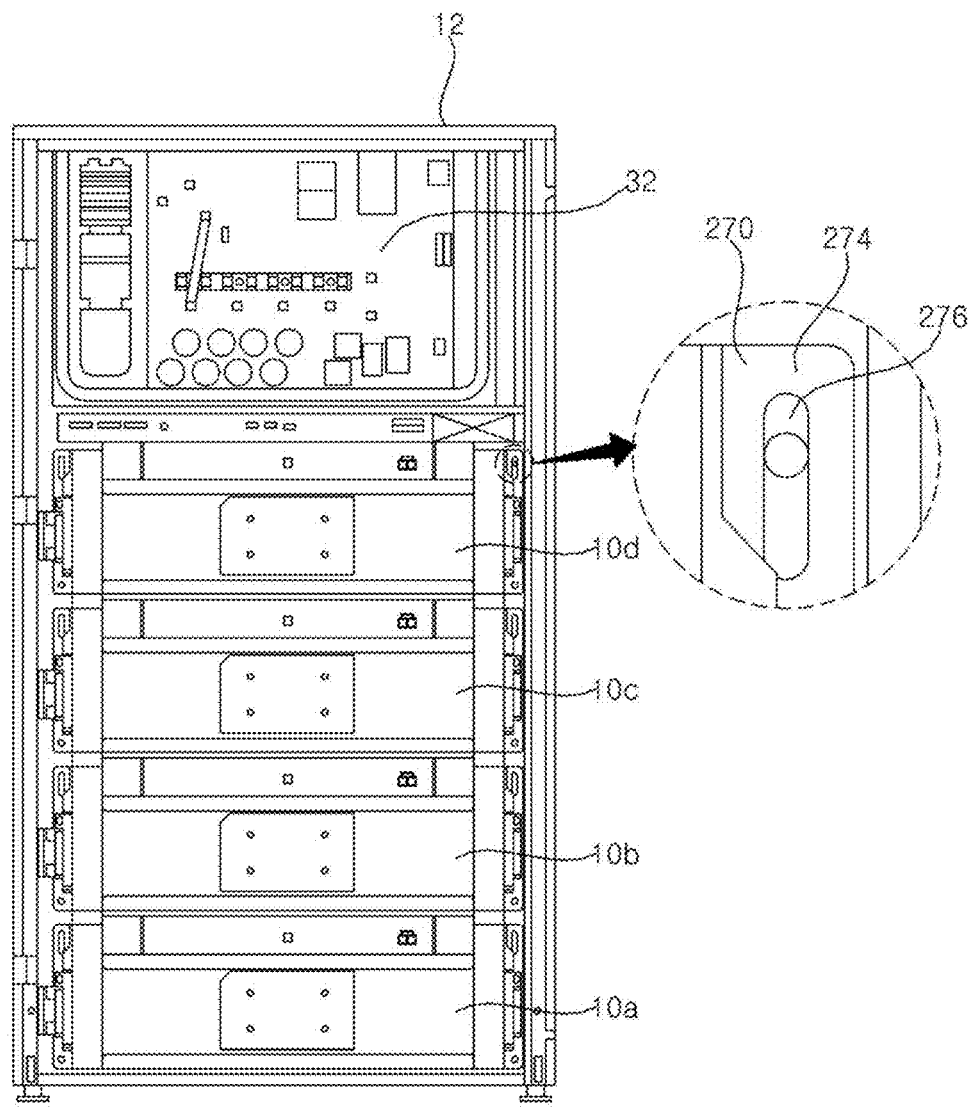
FIG. 6 is a front view of an energy storage system in a state in which a door is removed.
Figure 7:
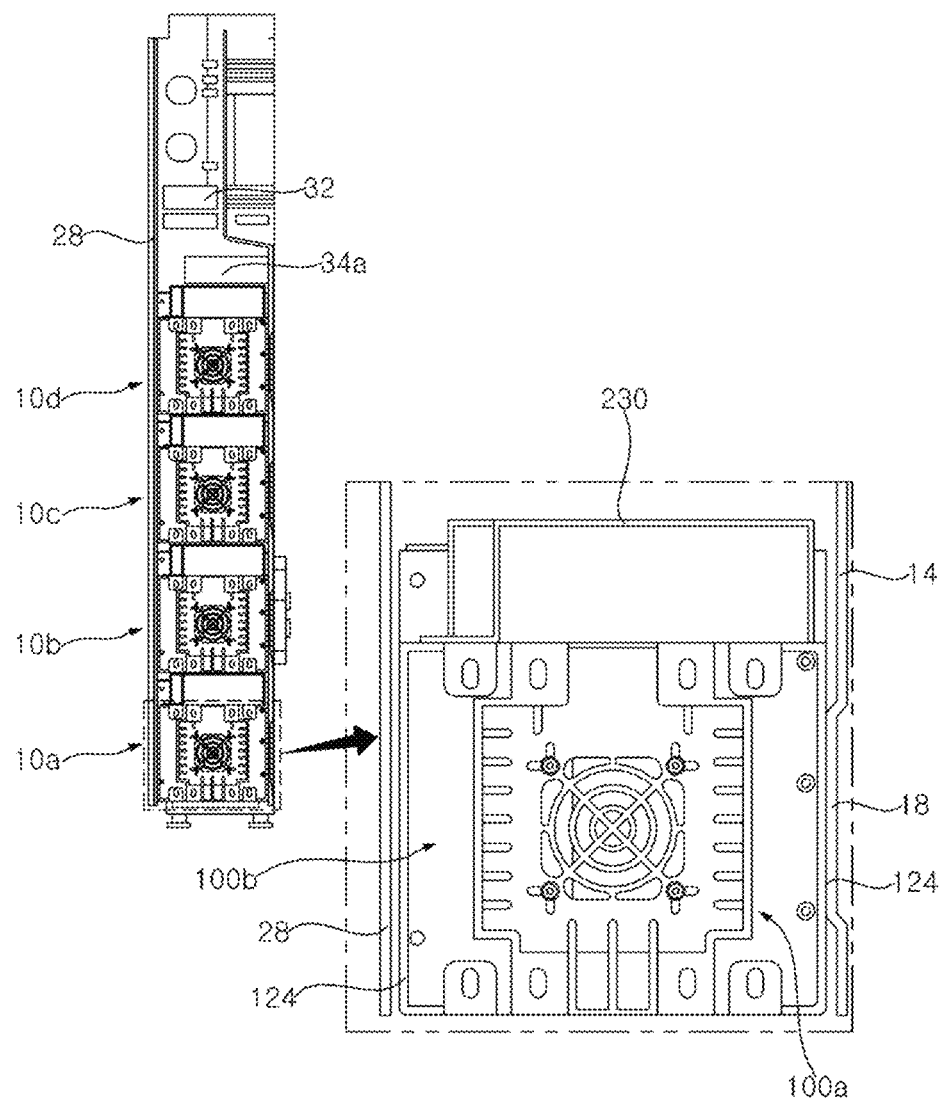
FIG. 7 is a cross-sectional view of one side of the energy storage system of FIG. 6.

FIG. 5 is an exploded perspective view of an energy storage system including a plurality of battery packs according to an embodiment of the present disclosure, FIG. 6 is a front view of an energy storage system in a state in which a door is removed, and FIG. 7 is a cross-sectional view of one side of the energy storage system of FIG. 6.

Figure 10:
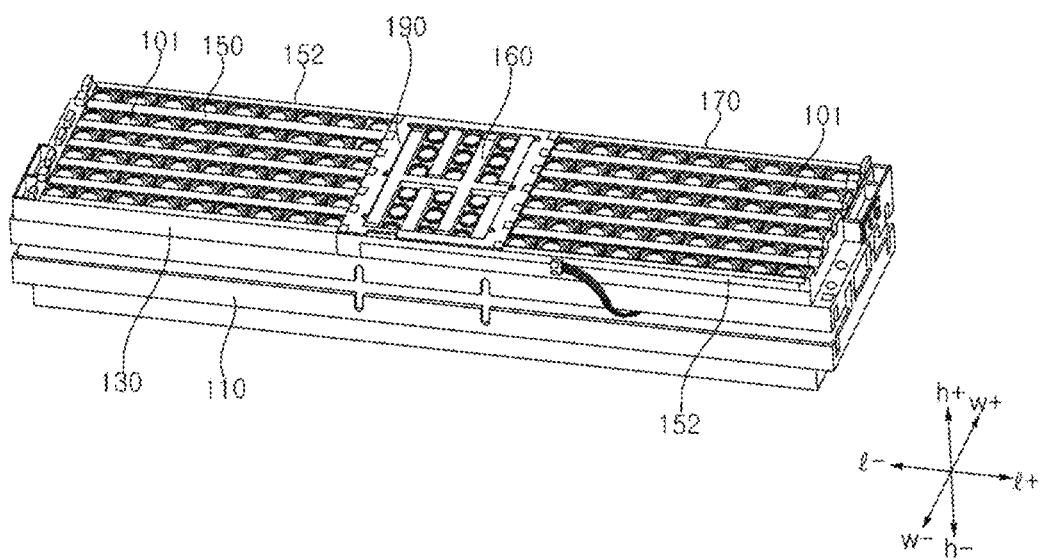
FIG. 10 is a perspective view of a battery module according to an embodiment of the present disclosure.

Referring to FIG. 5, the energy storage system 1 includes at least one battery pack 10, a casing 12 forming a space in which at least one battery pack 10 is disposed, a door 28 for opening and closing the front surface (or a front) of the casing 12, a power conditioning system 32 (PCS) which is disposed inside the casing 12 and converts the characteristics of electricity so as to charge or discharge a battery, and a battery management system (BMS) that monitors information (or parameters) such as current, voltage, and temperature of the battery cell 101 (see, e.g., FIG. 10).

The casing 12 may have an open front shape. The casing 12 may include a casing rear wall 14 covering the rear, a pair of casing side walls 20 extending to the front from both side ends of the casing rear wall 14, a casing top wall 24 extending to the front from the upper end of the casing rear wall 14, and a casing base 26 extending to the front from the lower end of the casing rear wall 14. The casing rear wall 14 includes a pack fastening portion 16 formed to be fastened with the battery pack 10 and a contact plate 18 protruding to (or toward) the front to contact a heat dissipation plate 124 (see, e.g., FIG. 7) of the battery pack 10.

Referring to FIG. 5, the contact plate 18 may be disposed to protrude to the front from the casing rear wall 14. The contact plate 18 may be disposed to contact one side of the heat dissipation plate 124. Accordingly, heat emitted from the plurality of battery cells 101 disposed inside the battery pack 10 may be radiated outside through the heat dissipation plate 124 and the contact plate 18.

A switch 22a, 22b for turning on/off the power of the energy storage system 1 may be disposed in (or at) one of the pair of casing sidewalls 20. In the present disclosure, a first switch 22a and a second switch 22b are disposed to enhance the safety of the power supply or the safety of the operation of the energy storage system 1.

The power conditioning system 32 may include a circuit substrate 33 and an insulated gate bipolar transistor (IGBT) 33 that is disposed in (or at) one side of the circuit substrate 33 and performs power conversion.

The battery monitoring system may include a battery pack circuit substrate 220 (see, e.g., FIG. 9) disposed in each of the plurality of battery packs 10a, 10b, 10c, 10d, and a main circuit substrate 34a which is disposed inside the casing 12 and connected to a plurality of battery pack circuit substrates 220 through a communication line 36.

The main circuit substrate 34a may be connected (or coupled) to the battery pack circuit substrate 220 disposed in each of the plurality of battery packs 10a, 10b, 10c, and 10d by (or via) the communication line 36. The main circuit substrate 34a may be connected to a power line 198 extending from the battery pack 10.

At least one battery pack 10a, 10b, 10c, and 10d may be disposed inside the casing 12. For example, a plurality of battery packs 10a, 10b, 10c, and 10d are disposed inside the casing 12. The plurality of battery packs 10a, 10b, 10c, and 10d may be disposed in (or along) the vertical direction.

The plurality of battery packs 10a, 10b, 10c, and 10d may be disposed such that the upper end and lower end of each side bracket 250a, 250b (see, e.g., FIG. 8) contact each other. Each of the battery packs 10a, 10b, 10c, and 10d disposed vertically is disposed such that battery module 100a, 100b and the top cover 230 do not contact each other (see, e.g., FIG. 9).

Each of the plurality of battery packs 10 is fixedly disposed in the casing 12. Each of the plurality of battery packs 10a, 10b, 10c, and 10d is fastened to the pack fastening portion 16 disposed in the casing rear wall 14. That is, the fixing bracket 270 (see, e.g., FIG. 6) of each of the plurality of battery packs 10a, 10b, 10c, and 10d is fastened to the pack fastening portion 16. The pack fastening portion 16 may be disposed to protrude to (or toward) the front from the casing rear wall 14 like (or similar to) the contact plate 18.

The contact plate 18 may be disposed to protrude to the front from the casing rear wall 14. Accordingly, the contact plate 18 may be disposed to be in contact with a heat dissipation plate 124 included in the battery pack 10.

One battery pack 10 includes two battery modules 100a and 100b. Accordingly, two heat dissipation plates 124 are disposed in one battery pack 10. One heat dissipation plate 124 included in the battery pack 10 is disposed to face the casing rear wall 14, and the other heat dissipation plate 124 is disposed to face the door 28.

One heat dissipation plate 124 is disposed to contact the contact plate 18 disposed in the casing rear wall 14, and the other heat dissipation plate 124 is disposed to be spaced apart from the door 28. The other heat dissipation plate 124 may be cooled by air flowing inside the casing 12.

Figure 8:
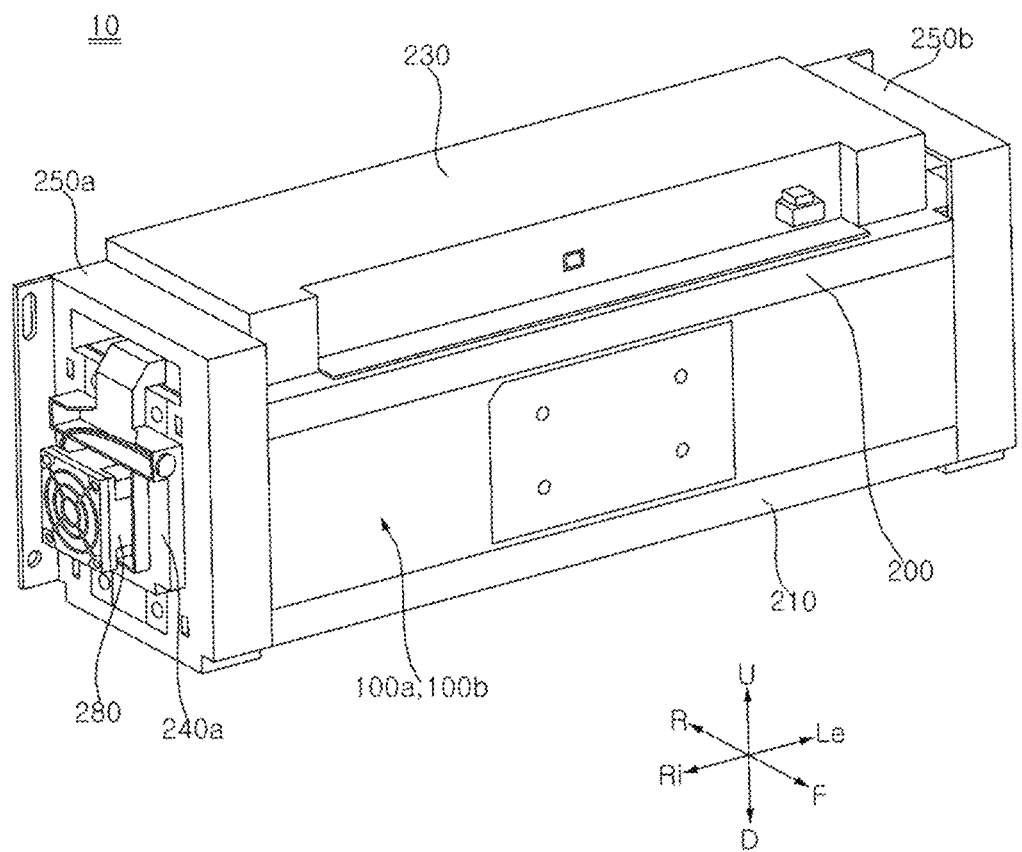
FIG. 8 is a perspective view of a battery pack according to an embodiment of the present disclosure.
Figure 9:
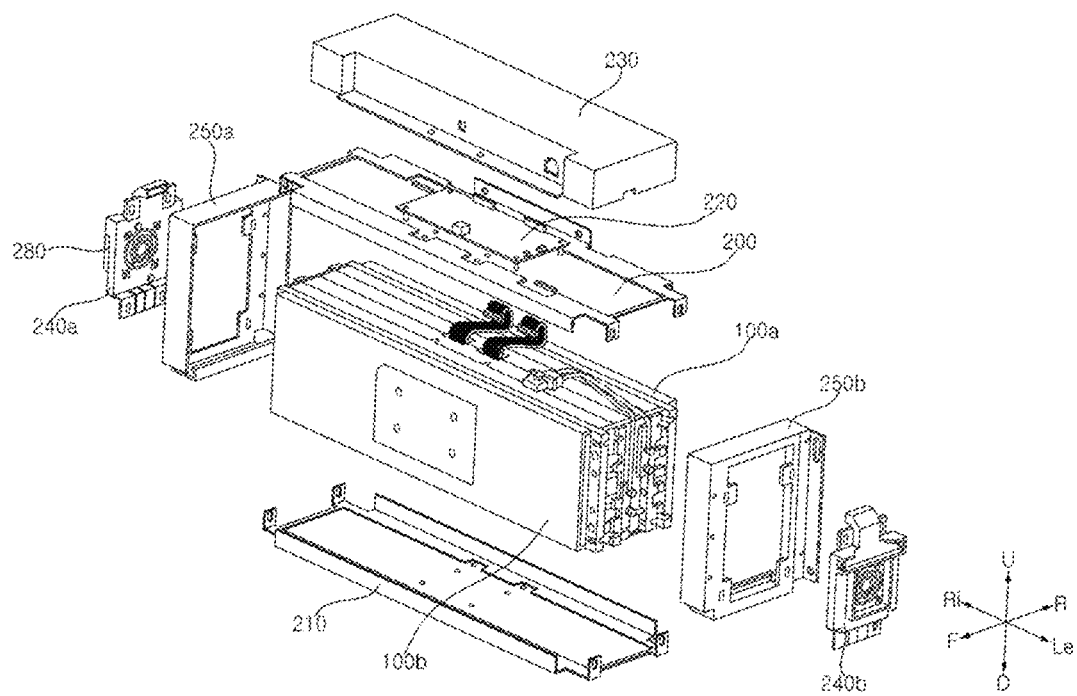
FIG. 9 is an exploded view of a battery pack according to an embodiment of the present disclosure.

FIG. 8 is a perspective view of a battery pack according to an embodiment of the present disclosure, and FIG. 9 is an exploded view of a battery pack according to an embodiment of the present disclosure.

The energy storage system of the present disclosure may include a battery pack 10 in which a plurality of battery cells 101 are connected in series and in parallel. The energy storage system may include a plurality of battery packs 10a, 10b, 10c, and 10d (refer to FIG. 5).

First, a configuration of one battery pack 10 will be described with reference to FIGS. 8 to 9. The battery pack 10 includes at least one battery module 100a, 100b at which a plurality of battery cells 101 are connected in series and parallel, an upper fixing bracket 200 which is disposed in (or at) an upper portion of the battery module 100a, 100b and fixes the disposition (or positioning) of the battery module 100a, 100b, a lower fixing bracket 210 which is disposed in (or at) a lower portion of the battery module 100a, 100b and fixes the disposition of the battery modules 100a and 100b, a pair of side brackets 250a, 250b which are disposed in (or at) side surfaces of the battery module 100a, 100b and fixes the disposition of the battery module 100a, 100b, a pair of side covers 240a, 240b which are disposed in (or at) side surfaces of the battery module 100a, 100b, and in which a cooling hole 242a is formed, a cooling fan 280 which is disposed in one side surface of the battery module 100a, 100b and forms an air flow inside the battery module 100a, 100b, a battery pack circuit substrate 220 which is disposed in (or at) the upper side of the upper fixing bracket 200 and collects sensing information of the battery module 100a, 100b, and a top cover 230 which is disposed in (or at) the upper side of the upper fixing bracket 200 and covers the upper side of the battery pack circuit substrate 220.

The battery pack 10 includes at least one battery module 100a, 100b. Referring to FIG. 9, the battery pack 10 of the present disclosure includes a battery module assembly 100 configured of two battery modules 100a, 100b which are electrically connected (or coupled) to each other and physically fixed. The battery module assembly 100 includes a first battery module 100a and a second battery module 100b disposed to face each other.

Figure 11:
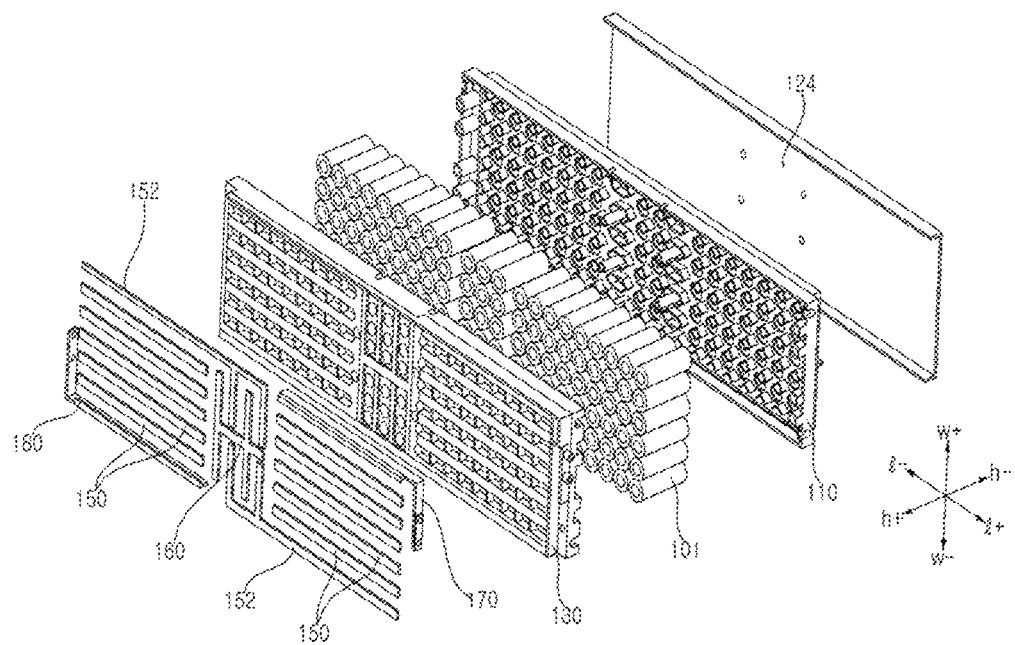
FIG. 11 is an exploded view of a battery module according to an embodiment of the present disclosure.

FIG. 10 is a perspective view of a battery module according to an embodiment of the present disclosure and FIG. 11 is an exploded view of a battery module according to an embodiment of the present disclosure.

Figure 12:
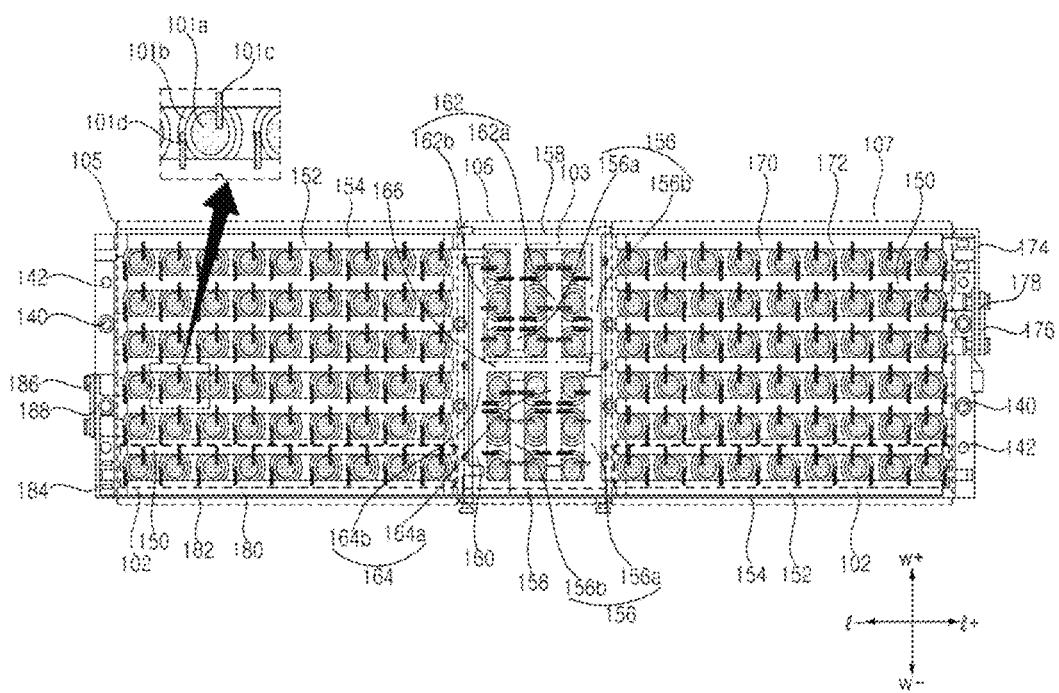
FIG. 12 is a front view of a battery module according to an embodiment of the present disclosure.
Figure 13:
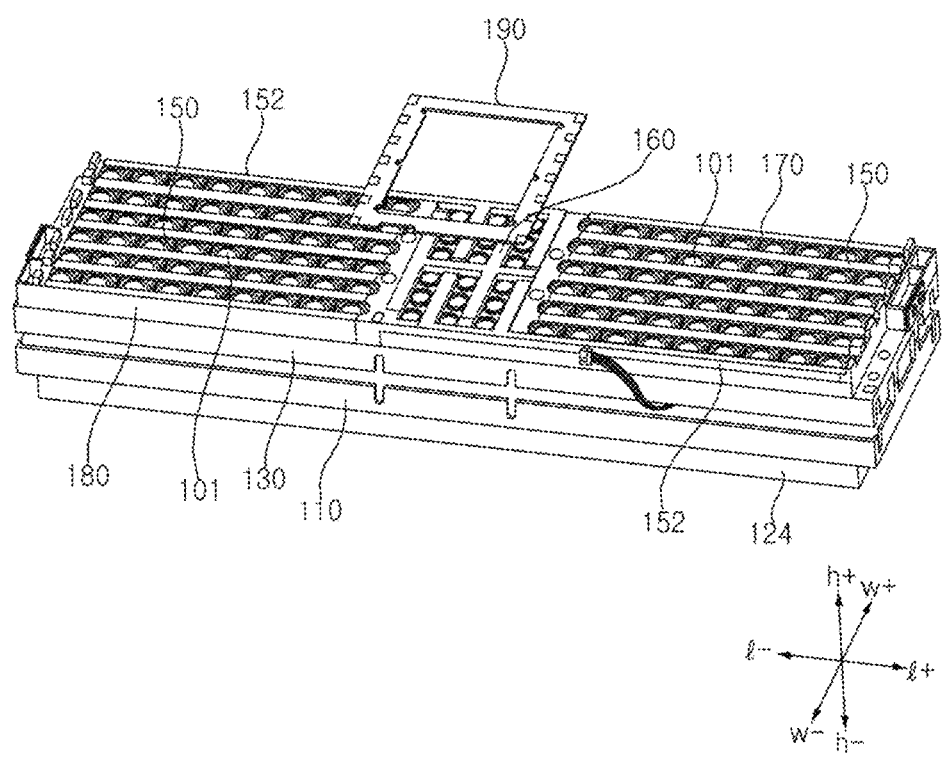
FIG. 13 is an exploded perspective view of a battery module and a sensing substrate according to an embodiment of the present disclosure.

FIG. 12 is a front view of a battery module according to an embodiment of the present disclosure and FIG. 13 is an exploded perspective view of a battery module and a sensing substrate according to an embodiment of the present disclosure.

Hereinafter, the first battery module 100a of the present disclosure will be described with reference to FIGS. 10 to 13. The configuration and shape of the first battery module 100a described below may also be applied (or applicable) to the second battery module 100b.

The battery module described in FIGS. 10 to 13 may be described with reference to a vertical direction based on the height direction (h+, h−) of the battery module. The battery module described in FIGS. 10 to 13 may be described with reference to the left-right direction based on the length direction (l+, l−) of the battery module. The battery module described in FIGS. 10 to 13 may be described with reference to the front-rear direction based on the width direction (w+, w−) of the battery module. The direction setting of the battery module used in FIGS. 10 to 13 may be different from the direction setting in a structure of the battery pack 10 described with reference to other drawings. In the battery module described in FIGS. 10 to 13, the width direction (w+, w−) of the battery module may be described as a first direction, and the length direction (l+, l−) of the battery module may be described as a second direction.

The first battery module 100a includes a plurality of battery cells 101, a first frame 110 for fixing the lower portion of the plurality of battery cells 101, a second frame 130 for fixing the upper portion of the plurality of battery cells 101, a heat dissipation plate 124 which is disposed in the lower side of the first frame 110 and dissipates heat generated from the battery cell 101, a plurality of bus bars which are disposed in (or at) the upper side of the second frame 130 and electrically connect the plurality of battery cells 101, and a sensing substrate 190 which is disposed (or at) in the upper side of the second frame 130 and detects information of the plurality of battery cells 101.

The first frame 110 and the second frame 130 may fix the disposition (or positioning) of the plurality of battery cells 101. In the first frame 110 and the second frame 130, the plurality of battery cells 101 are disposed to be spaced apart from each other. Since the plurality of battery cells 101 are spaced apart from each other, air may flow into a space between the plurality of battery cells 101 by the operation of the cooling fan 280 described below.

The first frame 110 fixes the lower end of the battery cell 101. The first frame 110 includes a lower plate 112 having a plurality of battery cell holes 112a formed therein, a first fixing protrusion 114 which protrudes upward from the upper surface of the lower plate 112 and fixes the disposition of the battery cell 101, a pair of first sidewalls 116 which protrudes upward from both ends of the lower plate 112, and a pair of first end walls 118 which protrudes upward from both ends of the lower plate 112 and connects both ends of the pair of first side walls 116.

The pair of first sidewalls 116 may be disposed parallel to a first cell array 102 described below. The pair of first end walls 118 may be disposed perpendicular to the pair of first side walls 116.

Referring to FIG. 13, the first frame 110 includes a first fastening protrusion 120 protruding to be fastened to the second frame 130, and a module fastening protrusion 122 protruding to be fastened with the first frame 110 included in the second battery module 100b disposed adjacently. A frame screw 125 for fastening the second frame 130 and the first frame 110 is disposed in the first fastening protrusion 120. A module screw 194 (see, e.g., FIG. 15A) for fastening the first battery module 100a and the second battery module 100b is disposed in the module fastening protrusion 122. The frame screw 125 fastens the second frame 130 and the first frame 110. The frame screw 125 may fix the disposition of the plurality of battery cells 101 by fastening the second frame 130 and the first frame 110.

The plurality of battery cells 101 are fixedly disposed in the second frame 130 and the first frame 110. A plurality of battery cells 101 are disposed in series and in parallel. The plurality of battery cells 101 are fixedly disposed by a first fixing protrusion 114 of the first frame 110 and a second fixing protrusion 134 of the second frame 130.

Referring to FIG. 12, the plurality of battery cells 101 are spaced apart from each other in the length direction (l+, l−) and the width direction (w+, w−) of the battery module.

The plurality of battery cells 101 includes a cell array connected in parallel to one bus bar. The cell array may refer to a set electrically connected in parallel to one bus bar.

The first battery module 100a may include a plurality of cell arrays 102 and 103 electrically connected in series. The plurality of cell arrays 102 and 103 are electrically connected to each other in series. The first battery module 100a has a plurality of cell arrays 102 and 103 connected in series.

The plurality of cell arrays 102 and 103 may include a first cell array 102 in which a plurality of battery cells 101 are disposed in (or along) a straight line, and a second cell array 103 in which a plurality of cell array rows and columns are disposed.

The first battery module 100a may include a first cell array 102 in which a plurality of battery cells 101 are disposed in (or along) a straight line, and a second cell array 103 in which a plurality of rows and columns are disposed.

Referring to FIG. 12, in the first cell array 102, a plurality of battery cells 101 are disposed in (or at) the left and right side in (or along) the length direction (l+, l−) of the first battery module 100a. The plurality of first cell arrays 102 are disposed in (or at) the front and rear side in (or along) the width direction (w+, w−) of the first battery module 100a.

Referring to FIG. 12, the second cell array 103 includes a plurality of battery cells 101 spaced apart from each other in the width direction (w+, w−) and the length direction (l+, l−) of the first battery module 100a.

The first battery module 100a includes a first cell group 105 in which a plurality of first cell arrays 102 are disposed in parallel, and a second cell group 106 that includes at least one second cell array 103 and is disposed in (or at) one side of the first cell group 105.

The first battery module 100a includes a first cell group 105 in which a plurality of first cell arrays 102 are connected in series, and a third cell group 107 in which a plurality of first cell arrays 102 are connected in series, and which are spaced apart from the first cell group 105. The second cell group is disposed between the first cell group 105 and the third cell group 107.

In the first cell group 105, a plurality of first cell arrays 102 are connected in series. In the first cell group 105, a plurality of first cell arrays 102 are spaced apart from each other in (or along) the width direction of the battery module. The plurality of first cell arrays 102 included in the first cell group 105 are spaced apart in (or along) a direction perpendicular to the direction in which the plurality of battery cells 101 included in each of the first cell arrays 102 are disposed.

Referring to FIG. 12, nine battery cells 101 connected in parallel are disposed in each of the first cell array 102 and the second cell array 103. Referring to FIG. 12, in the first cell array 102, nine battery cells 101 are spaced apart from each other in (or along) the length direction of the battery module. In the second cell array 103, nine battery cells are spaced apart from each other in a plurality of rows and a plurality of columns. Referring to FIG. 12, in the second cell array 103, three battery cells 101 that are spaced apart from each other in (or along) the width direction of the battery module are spaced apart from each other in the length direction of the battery module. Here, the length direction (l+, l−) of the battery module may be set as (or may refer to) a column direction, and the width direction (w+, w−) of the battery module may be set as (or may refer to) a row direction.

Referring to FIG. 12, each of the first cell group 105 and the third cell group 107 is disposed such that six first cell arrays 102 are connected in series. In each of the first cell group 105 and the third cell group 107, six first cell arrays 102 are spaced apart from each other in (or along) the width direction of the battery module.

Referring to FIG. 12, the second cell group 106 includes two second cell arrays 103. The two second cell arrays 103 are spaced apart from each other in (or along) the width direction of the battery module. The two second cell arrays 103 are connected in parallel to each other. Each of the two second cell arrays 103 is disposed symmetrically with respect to the horizontal bar 166 of a third bus bar 160 described below.

The first battery module 100a includes a plurality of bus bars which are disposed between the plurality of battery cells 101, and electrically connect the plurality of battery cells 101. Each of the plurality of bus bars connects in parallel the plurality of battery cells included in a cell array disposed adjacent to each other. Each of the plurality of bus bars may connect in series two cell arrays disposed adjacent to each other.

The plurality of bus bars includes a first bus bar 150 connecting the two first cell arrays 102 in series, a second bus bar 152 connecting the first cell array 102 and the second cell array 103 in series, and a third bus bar 160 connecting the two second cell arrays 103 in series.

The plurality of bus bars include a fourth bus bar 170 connected to one first cell array 102 in series. The plurality of bus bars include a fourth bus bar 170 which is connected to one first cell array 102 in series and connected to the other battery module 100b included in the same battery pack 10, and a fifth bus bar 180 which is connected to one first cell array 102 in series and connected to one battery module included in the other battery pack 10. The fourth bus bar 170 and the fifth bus bar 180 may have the same shape.

The first bus bar 150 is disposed between two first cell arrays 102 spaced apart from each other in (or along) the length direction of the battery module. The first bus bar 150 connects in parallel a plurality of battery cells 101 included in one first cell array 102. The first bus bar 150 connects in series the two first cell arrays 102 disposed in (or along) the length direction (l+, l−) of the battery module.

Referring to FIG. 12, the first bus bar 150 is electrically connected to a positive terminal 101a of each of the battery cells 101 of the first cell array 102 which is disposed in (or at) the front in (or along) the width direction (w+, w−) of the battery module, and the first bus bar 150 is electrically connected to a negative terminal 101b of each of the battery cells 101 of the first cell array 102 which is disposed in (or at) the rear in (or along) the width direction (w+, w−) of the battery module.

Referring to FIG. 12, in the battery cell 101, the positive terminal 101a and the negative terminal 101b are partitioned in (or at) the upper end thereof. In the battery cell 101, the positive terminal 101a is disposed in (or at) the center of a top surface formed in a circle, and the negative terminal 101b is disposed in (or at) the circumference portion of the positive terminal 101a. Each of the plurality of battery cells 101 may be connected to each of the plurality of bus bars through a cell connector 101c, 101d.

The first bus bar 150 has a straight bar shape. The first bus bar 150 is disposed between the two first cell arrays 102. The first bus bar 150 is connected to the positive terminal of the plurality of battery cells 101 included in the first cell array 102 disposed in one side, and is connected to the negative terminal of the plurality of battery cells 101 included in the first cell array 102 disposed in the other side.

The first bus bar 150 is disposed between the plurality of first cell arrays 102 disposed in the first cell group 105 and the third cell group 107.

The second bus bar 152 connects the first cell array 102 and the second cell array 103 in series. The second bus bar 152 includes a first connecting bar 154 connected to the first cell array 102 and a second connecting bar 156 connected to the second cell array 103. The second bus bar 152 is disposed perpendicular to the first connecting bar 154. The second bus bar 152 includes an extension portion 158 that extends from the first connecting bar 154 and is connected to the second connecting bar 156.

The first connecting bar 154 may be connected to different electrode terminals of the second connecting bar 156 and the battery cell. Referring to FIG. 12, the first connecting bar 154 is connected to the positive terminal 101a of the battery cell 101 included in the first cell array 102, and the second connecting bar 156 is connected to the negative terminal 101b of the battery cell 101 included in the second cell array 103. However, this is in reference to one embodiment, and it is possible for the connecting bars 154, 156 to be connected to an opposite electrode terminal.

The first connecting bar 154 is disposed in (or at) one side of the first cell array 102. The first connecting bar 154 has a straight bar shape extending in (or along) the length direction of the battery module. The extension portion 158 has a straight bar shape extending in (or along) the direction in which the first connecting bar 154 extends.

The second connecting bar 156 is disposed perpendicular to the first connecting bar 154. The second connecting bar 156 has a straight bar shape extending in (or along) the width direction (w+, w−) of the battery module. The second connecting bar 156 may be disposed in (or at) one side of the plurality of battery cells 101 included in the second cell array 103. The second connecting bar 156 may be disposed between the plurality of battery cells 101 included in the second cell array 103. The second connecting bar 156 extends in (or along) the width direction (w+, w−) of the battery module, and is connected to the battery cell 101 disposed in (or at) one side or both sides.

The second connecting bar 156 includes a connecting bar 156a and a connecting bar 156b spaced apart from the connecting bar 156a. The connecting bar 156a is disposed between the plurality of battery cells 101, and the connecting bar 156b is disposed in (or at) one side of the plurality of battery cells 101.

The third bus bar 160 connects in series the two second cell arrays 103 spaced apart from each other. The third bus bar 160 includes a first vertical bar 162 connected to one cell array among the plurality of second cell arrays 103, a second vertical bar 164 connected to the other cell array among the plurality of second cell arrays 103, and a horizontal bar 166 which is disposed between the plurality of second cell arrays 103 and connected to the first vertical bar 162 and the second vertical bar 164. The first vertical bar 162 and the second vertical bar 164 may be symmetrically disposed with respect to the horizontal bar 166.

A plurality of second vertical bars 164 may be disposed to be spaced apart from each other in (or along) the length direction (l+, l−) of the battery module. Referring to FIG. 12, a vertical bar 164a, and a vertical bar 164b which is spaced apart from the vertical bar 164a in (or along) the length direction of the battery module may be included.

The first vertical bar 162 or the second vertical bar 164 may be disposed parallel to the second connecting bar 156 of the second bus bar 152. The battery cell 101 included in the second cell array 103 may be disposed between the first vertical bar 162 and the second connecting bar 156. Similarly, the battery cell 101 included in the second cell array 103 may be disposed between the second vertical bar 164 and the second connecting bar 156.

The first battery module 100a includes a fourth bus bar 170 connected to the second battery module 100b included in the same battery pack 10, and a fifth bus bar 180 connected to a battery module included in another battery pack 10.

The fourth bus bar 170 is connected to the second battery module 100b which is another battery module included in the same battery pack 10. That is, the fourth bus bar 170 is connected to the second battery module 100b included in the same battery pack 10 through a high current bus bar 196 (see, e.g., FIG. 15A) described below.

The fifth bus bar 180 is connected to another battery pack 10. That is, the fifth bus bar 180 may be connected to a battery module included in another battery pack 10 through a power line 198 described below.

The fourth bus bar 170 includes a cell connecting bar 172 which is disposed in one side of the first cell array 102, and connects in parallel the plurality of battery cells 101 included in the first cell array 102, and an additional connecting bar 174 which is vertically bent from the cell connecting bar 172 and extends along the end wall of the second frame 130.

The cell connecting bar 172 is disposed in (or at) the second sidewall 136 of the second frame 130. The cell connecting bar 172 may be disposed to surround a portion of the outer circumference of the second sidewall 136. The additional connecting bar 174 is disposed outside the second end wall 138 of the second frame 130.

The additional connecting bar 174 includes a connecting hanger 176 to which the high current bus bar 196 is connected. The connecting hanger 176 is provided with a groove 178 opened upward. The high current bus bar 196 may be seated on the connecting hanger 176 through the groove 178. The high current bus bar 196 may be fixedly disposed in the connecting hanger 176 through a separate fastening screw while seated on the connecting hanger 176.

The fifth bus bar 180 may have the same configuration and shape as the fourth bus bar. That is, the fifth bus bar 180 includes a cell connecting bar 182 and an additional connecting bar 184. The additional connecting bar 184 of the fifth bus bar 180 includes a connecting hanger 186 to which a terminal 198a of the power line 198 is connected. The connecting hanger 186 is provided with a groove 188 into which the terminal 198a of the power line 198 is inserted.

The sensing substrate 190 is electrically connected to a plurality of bus bars disposed inside the first battery module 100a. The sensing substrate 190 may be electrically connected to each of the plurality of first bus bars 150, the plurality of second bus bars 152, the third bus bar 160, and the plurality of fourth bus bars 170. The sensing substrate 190 is connected to each of the plurality of bus bars, so that information such as voltage and current values of the plurality of battery cells 101 included in the plurality of cell arrays can be obtained.

The sensing substrate 190 may have a rectangular ring shape. The sensing substrate 190 may be disposed between the first cell group 105 and the third cell group 107. The sensing substrate 190 may be disposed to surround the second cell group 106. The sensing substrate 190 may be disposed to partially overlap the second bus bar 152.

Figure 14:
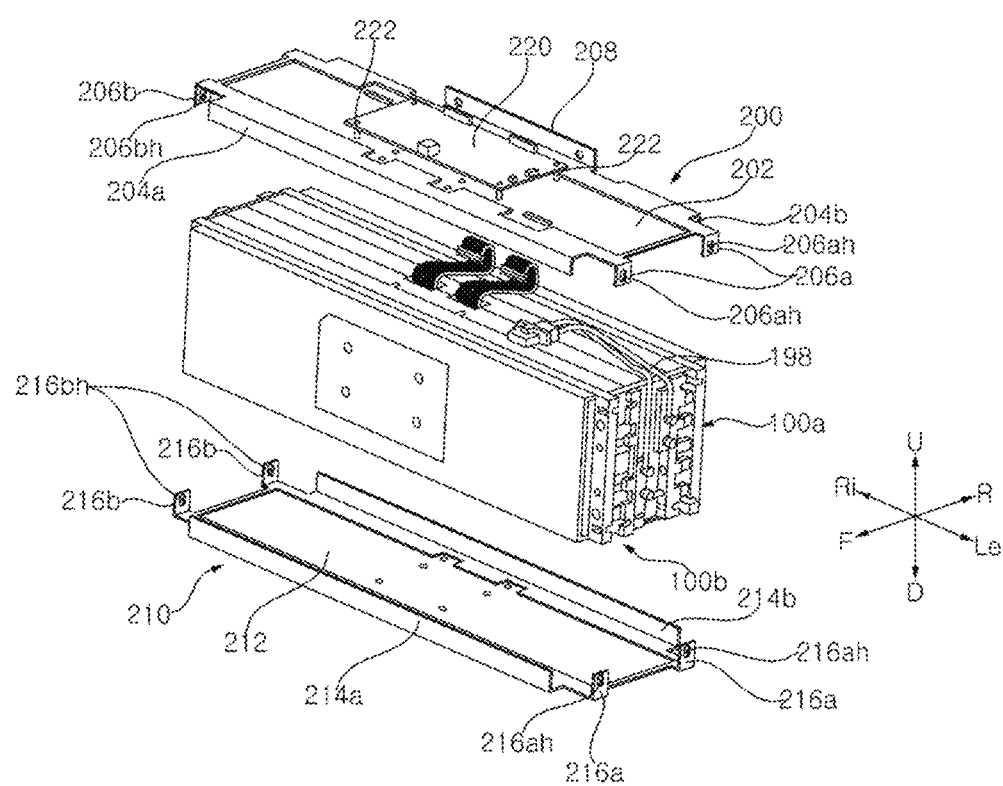
FIG. 14 is a perspective view of a battery module and a battery pack circuit substrate according to an embodiment of the present disclosure.
Figure 15A:
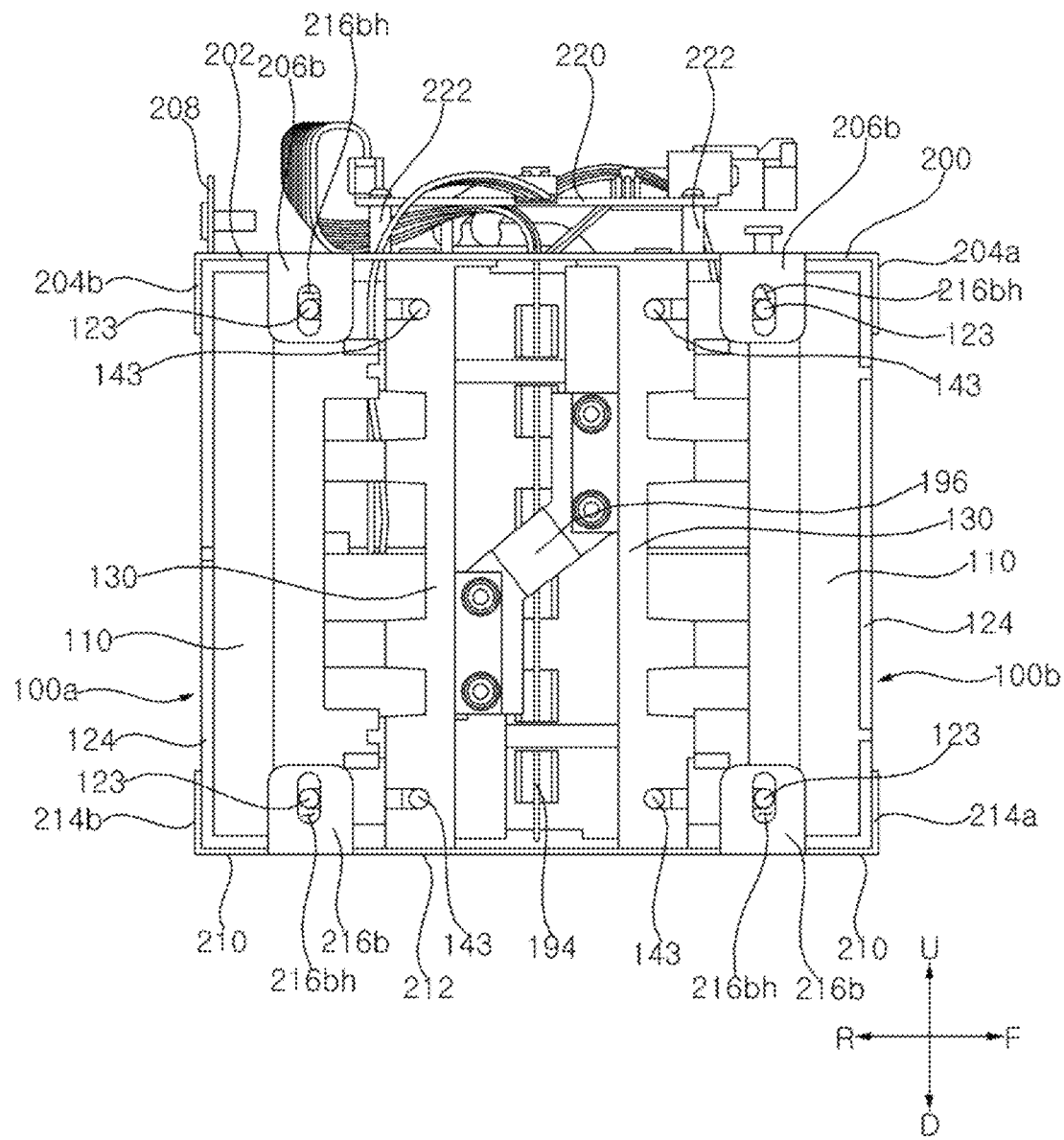
FIG. 15A is a side view of the battery module and the battery pack circuit substrate of FIG. 14 in a coupled state.
Figure 15B:
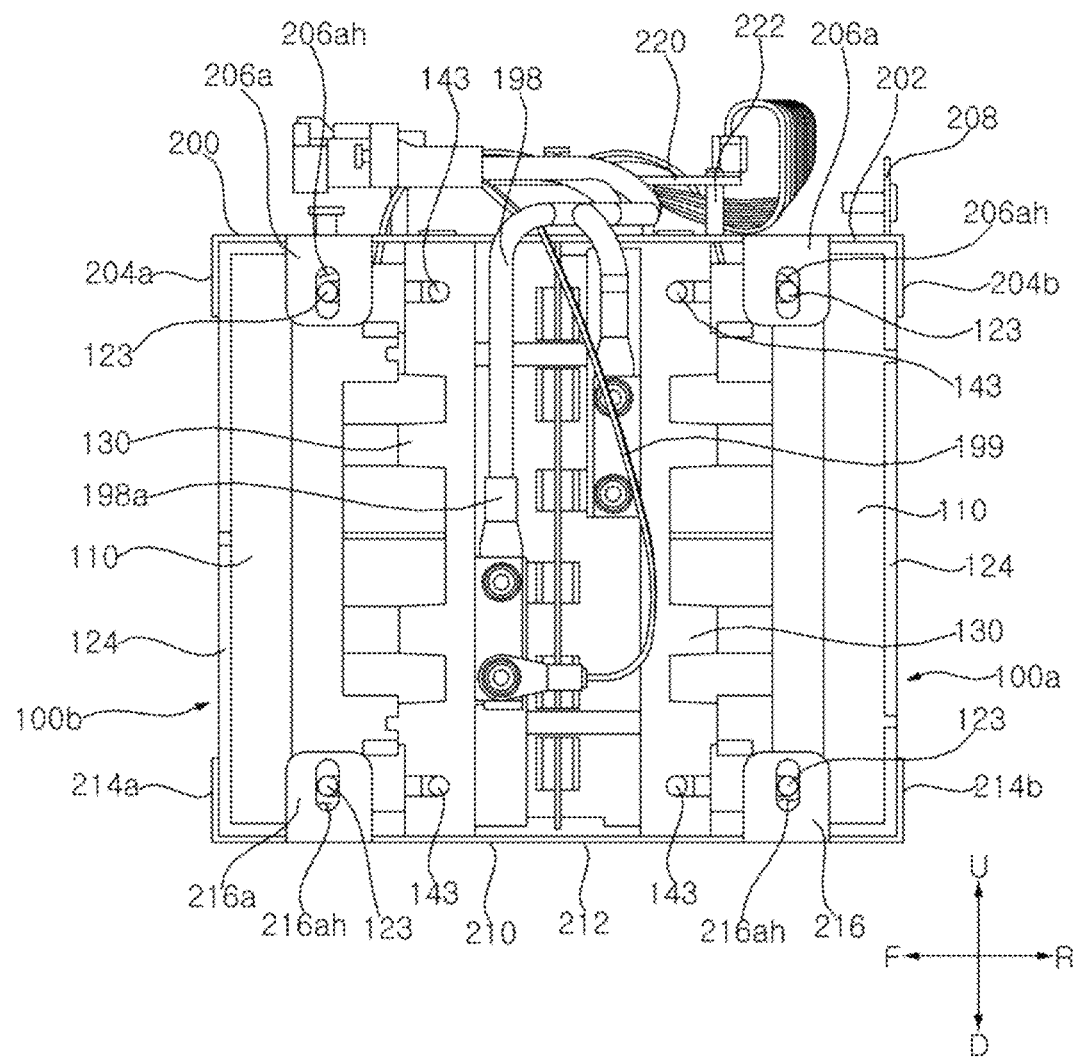
FIG. 15B is another side view of the battery module and the battery pack circuit substrate of FIG. 14 in a coupled state.

FIG. 14 is a perspective view of a battery module and a battery pack circuit substrate according to an embodiment of the present disclosure, FIG. 15A is a side view of the battery module and the battery pack circuit substrate of FIG. 14 in a coupled state, and FIG. 15B is another side view of the battery module and the battery pack circuit substrate of FIG. 14 in a coupled state.

Referring to FIGS. 14 to 15B, the battery pack 10 includes an upper fixing bracket 200 which is disposed in (or at) an upper portion of the battery module 100a, 100b and fixes the battery module 100a, 100b, a lower fixing bracket 210 which is disposed in (or at) a lower portion of the battery module 100a, 100b and fixes the battery modules 100a and 100b, a battery pack circuit substrate 220 which is disposed in (or at) an upper side of the upper fixing bracket 200 and collects sensing information of the battery module 100a, 100b, and a spacer 222 which separates the battery pack circuit substrate 220 from the upper fixing bracket 200.

The upper fixing bracket 200 is disposed in (or at) an upper side of the battery module 100a, 100b. The upper fixing bracket 200 includes an upper board 202 that covers at least a portion of the upper side of the battery module 100a, 100b, a first upper holder 204a which is bent downward from the front end of the upper board 202 and disposed to be in contact with the front portion of the battery module 100a, 100b, a second upper holder 204b which is bent downward from the rear end of the upper board 202 and disposed to be in contact with the rear portion of the battery module 100a, 100b, a first upper mounter 206a which is bent downward from a side end of the upper board 202 and coupled to a side of the battery module 100a, 100b, a second upper mounter 206b which is bent downward from the other side end of the upper board 202 and coupled to the other side of the battery module 100a, 100b, and a rear bender 208 which is bent upward from the rear end of the upper board 202.

The upper board 202 is disposed in (or at) the upper side of the battery module 100a, 100b. Each of the first upper mounter 206a and the second upper mounter 206b is disposed to surround the front and rear of the battery module 100a, 100b. Accordingly, the first upper mounter 206a and the second upper mounter 206b may maintain a state in which the first battery module 100a and the second battery module 100b are coupled.

A pair of first upper mounters 206a spaced apart in the front-rear direction are disposed in (or at) one side end of the upper board 202. A pair of second upper mounters 206b spaced apart in the front-rear direction are disposed in (or at) the other side end of the upper board 202.

The pair of first upper mounters 206a are coupled to the first fastening hole 123 (see, e.g., FIG. 15A) formed in the first battery module 100a and the second battery module 100b. In each of the pair of first upper mounters 206a, a first upper mounter hole 206ah is formed in a position corresponding to the first fastening hole 123. Similarly, the pair of second upper mounters 206b are coupled to the first fastening hole 123 formed in the first battery module 100a and the second battery module 100b, and a second upper mounter hole 206bh is formed in a position corresponding to the first fastening hole 123.

The position of the upper fixing bracket 200 can be fixed in (or at) the upper side of the battery module 100a, 100b by the first upper holder 204a, the second upper holder 204b, the first upper mounter 206a, and the second upper mounter 206b. That is, due to the above structure, the upper fixing bracket 200 can maintain the structure of the battery module 100a, 100b.

The upper fixing bracket 200 is fixed to the first frame 110 of each of the first battery module 100a and the second battery module 100b. Each of the first upper mounter 206a and the second upper mounter 206b of the upper fixing bracket 200 is fixed to the first fastening hole 123 formed in the first frame 110 of each of the first battery module 100a and the second battery module 100b.

The rear bender 208 may fix a top cover 230 described below. The rear bender 208 may be fixed to a rear wall 234 of the top cover 230. The rear bender 208 may limit the rear movement of the top cover 230. Accordingly, it is possible to facilitate fastening of the top cover 230 and the upper fixing bracket 200.

The lower fixing bracket 210 is disposed in (or at) the lower side of the battery module 100a, 100b. The lower fixing bracket 210 includes a lower board 212 that covers at least a portion of the lower portion of the battery module 100a, 100b, a first lower holder 214a which is bent upward from the front end of the lower board 212 and disposed to be in contact with the front portion of the battery module 100a, 100b, a second lower holder 214b which is bent upward from the rear end of the lower board 212 and disposed to be in contact with the rear portion of the battery module 100a, 100b, a first lower mounter 216a which is bent upward from a side end of the lower board 212 and coupled to a side of the battery module 100a, 100b, and a second lower mounter 216b which is bent upward from the other side end of the lower board 212 and coupled to the other side of the battery module 100.

Each of the first lower mounter 216a and the second lower mounter 216b is disposed to surround the front and rear of the battery module 100a, 100b. Accordingly, the first lower mounter 216a and the second lower mounter 216b may maintain a state in which the first battery module 100a and the second battery module 100b are coupled.

A pair of first lower mounters 216a spaced apart in the front-rear direction are disposed in (or at) one side end of the lower board 212. A pair of second lower mounters 216b spaced apart in the front-rear direction are disposed in (or at) the other side end of the lower board 212.

The pair of first lower mounters 216a are coupled to the first fastening hole 123 formed in the first battery module 100a and the second battery module 100b. In each of the pair of first lower mounters 216a, a first lower mounter hole 216ah is formed in a position corresponding to the first fastening hole 123. Similarly, the pair of second lower mounters 216b are coupled to the first fastening hole 123 formed in the first battery module 100a and the second battery module 100b, and a second lower mounter hole 216bh is formed in a position corresponding to the first fastening hole 123.

The lower fixing bracket 210 is fixed to the first frame 110 of each of the first battery module 100a and the second battery module 100b. Each of the first lower mounter 216a and the second lower mounter 216b of the lower fixing bracket 210 is fixed to the first fastening hole 123 formed in the first frame 110 of each of the first battery module 100a and the second battery module 100b.

The battery pack circuit substrate 220 may be fixedly disposed in (or at) the upper side of the upper fixing bracket 200. The battery pack circuit substrate 220 is connected to the sensing substrate 190, the bus bar, or a thermistor 224 described below to receive information of a plurality of battery cells 101 disposed inside the battery pack 10. The battery pack circuit substrate 220 may transmit information of the plurality of battery cells 101 to the main circuit substrate 34a described below.

The battery pack circuit substrate 220 may be spaced apart from the upper fixing bracket 200 to be above the upper fixing bracket 200. A plurality of spacers 222 are disposed, between the battery pack circuit substrate 220 and the upper fixing bracket 200, to space the battery pack circuit substrate 220 upward from (e.g., to be above) the upper fixing bracket 200. The plurality of spacers 222 may be disposed in (or at) an edge portion of the battery pack circuit substrate 220.

Figure 16:
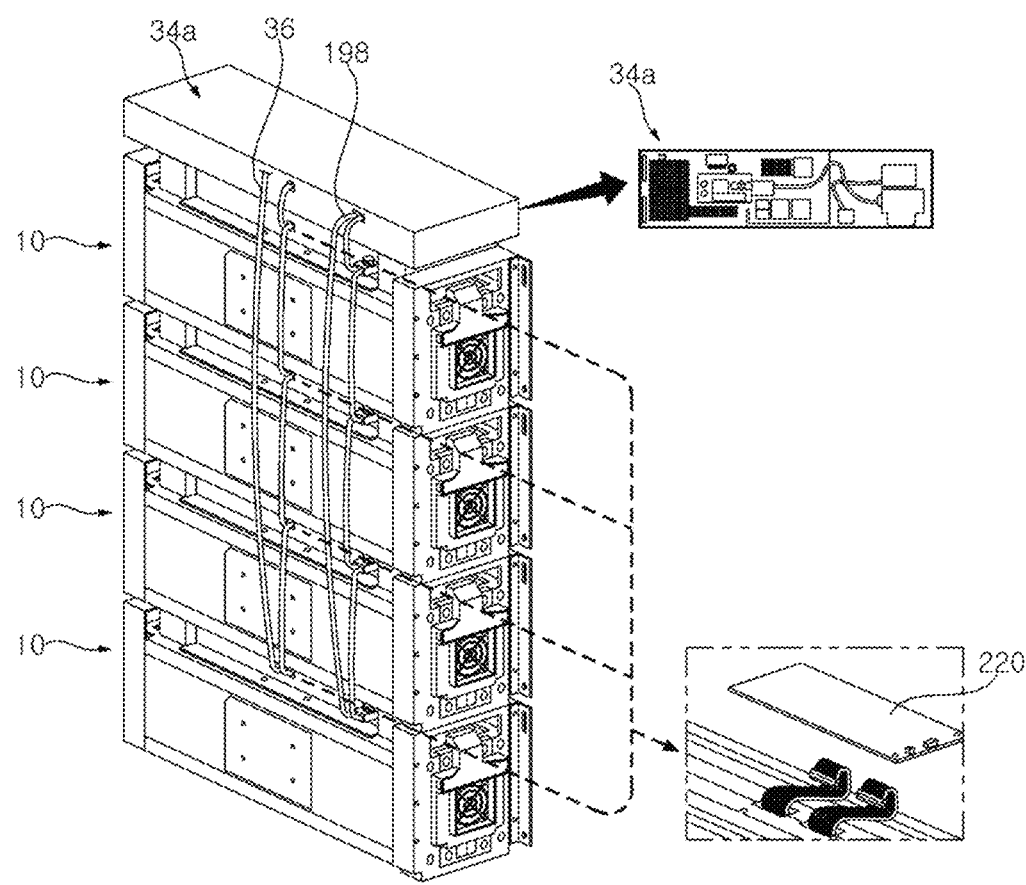
FIG. 16 is a diagram illustrating a connection between the battery pack and a battery management system according to an embodiment of the present disclosure.

FIG. 16 is a diagram illustrating a connection between the battery pack and the battery management system according to an embodiment of the present disclosure.

Referring to FIG. 16, the battery 35 that stores received electrical energy in DC form or outputs the stored electrical energy may include a plurality of battery packs 10. Each battery pack 10 includes a plurality of battery cells 101 connected in series and in parallel.

The battery pack 10 may include battery modules 100a and 100b in which the plurality of battery cells 101 are connected in series and in parallel, and the battery modules 100a and 100b may be electrically connected to each other.

The battery cells 101 may be connected in series to increase voltage, and may be connected in parallel to increase capacity. In order to increase both the voltage and the capacity, the battery cells 101 may be connected in series and in parallel.

The battery management system 34 for monitoring the state information of the battery 35 includes battery pack circuit boards 220 which are disposed in each of the plurality of battery packs 10, and obtain state information of the plurality of battery cells 101 included in each battery pack 10, and a main circuit board 34a which is connected (or coupled) to the battery pack circuit boards 220 by (or via) a communication line 36, and receives the state information obtained from each battery pack 10 from the battery pack circuit boards 220.

The energy storage system 1 according to an embodiment of the present disclosure includes the battery 35 that stores the received electrical energy in the form of direct current, or outputs the stored electrical energy, the power conditioning system 32 for converting an electrical characteristic so as to charge or discharge the battery 35, and the battery management system 34 for monitoring the state information of the battery 35. The battery 35 includes a plurality of battery packs 10 respectively including a plurality of battery cells 101, and the battery management system 34 includes battery pack circuit boards 220 which are disposed in each of the plurality of battery packs 10 and obtain state information of a plurality of battery cells 101 included in each battery pack 10, and a main circuit board 34a which is connected to the battery pack circuit boards 220 by (or via) a communication line 36 and receives state information obtained from each battery pack 10 from the battery pack circuit boards 220.

According to an embodiment of the present disclosure, by separately designing the control circuit 34a including a configuration for managing the battery 35 (particularly a configuration for safety control) from (or relative to) the battery cell sensing circuit (of the battery pack circuit boards 220), it is possible to perform the main function of the battery management system 34 and protect the control circuit 34a that manages the plurality of battery packs 10.

In the battery management system 34, a circuit composed of main components including a microcomputer unit (or microcomputer) 1780 among circuits for safety control may be separately configured. For example, when four battery packs 10 are configured to be connected, the battery management system 34 may be designed with one control circuit unit block 34a including the microcomputer unit 1780, and four battery unit blocks 220.

When the battery pack 10 is short-circuited due to an internal problem, the battery unit block 220 directly connected to the battery cell 101 may be damaged. However, the safety control circuit 34a is designed independently and can be protected without damage.

In addition, since the control circuit 34a and the battery cell sensing circuit (of the battery pack circuit boards 220) are separately configured, each circuit board 34a, 220 can be made to be smaller in size.

The state information transmitted from the battery pack circuit boards 220 to the main circuit board 34a may include at least one of current data, voltage data, or temperature data. In addition, some of the state information may be measured by a sensor mounted in the main circuit board 34a.

The battery pack circuit boards 220 are sensing and interface boards for sensing voltage, current, and temperature of the battery cells 101. In the battery pack circuit boards 220, a component for obtaining voltage, current, and temperature data of a plurality of battery cells 101 and an interface component for transmitting the obtained data to the main circuit board 34a may be mounted. The voltage, current, and temperature data of the plurality of battery cells 101 may be directly obtained from a sensor mounted in the battery pack circuit boards 220, or may be transmitted to the battery pack circuit substrates (or boards) 220 from a sensor disposed in (or at) the battery cell 101.

The plurality of battery packs 10 are connected in series by the power line 198. The power line 198 is connected to the main circuit board 34a. That is, the plurality of battery packs 10 and the main circuit board 34a are connected by the power line 198, and the voltages of the plurality of battery packs 10 are combined and applied to the main circuit board 34a. For example, a plurality of 4 kWh battery packs may be connected in series and disposed inside the casing 12. Two 4 kWh battery packs 10 may be connected to implement a total of 8 kWh combined, three 4 kWh battery packs 10 may be connected to implement a total of 12 kWh combined, and four 4 kWh battery packs 10 may be connected to implement a total of 16 kWh combined.

Two battery modules 100a and 100b may be combined to form a battery module assembly 100, and the battery pack circuit board 220 may be disposed in (or at) an upper portion of the battery module assembly 100.

The power conditioning system 32 for converting electrical characteristics for charging or discharging the battery 35 may be disposed in (or at) the upper side of the main circuit board 34a.

Figures 17, 18:
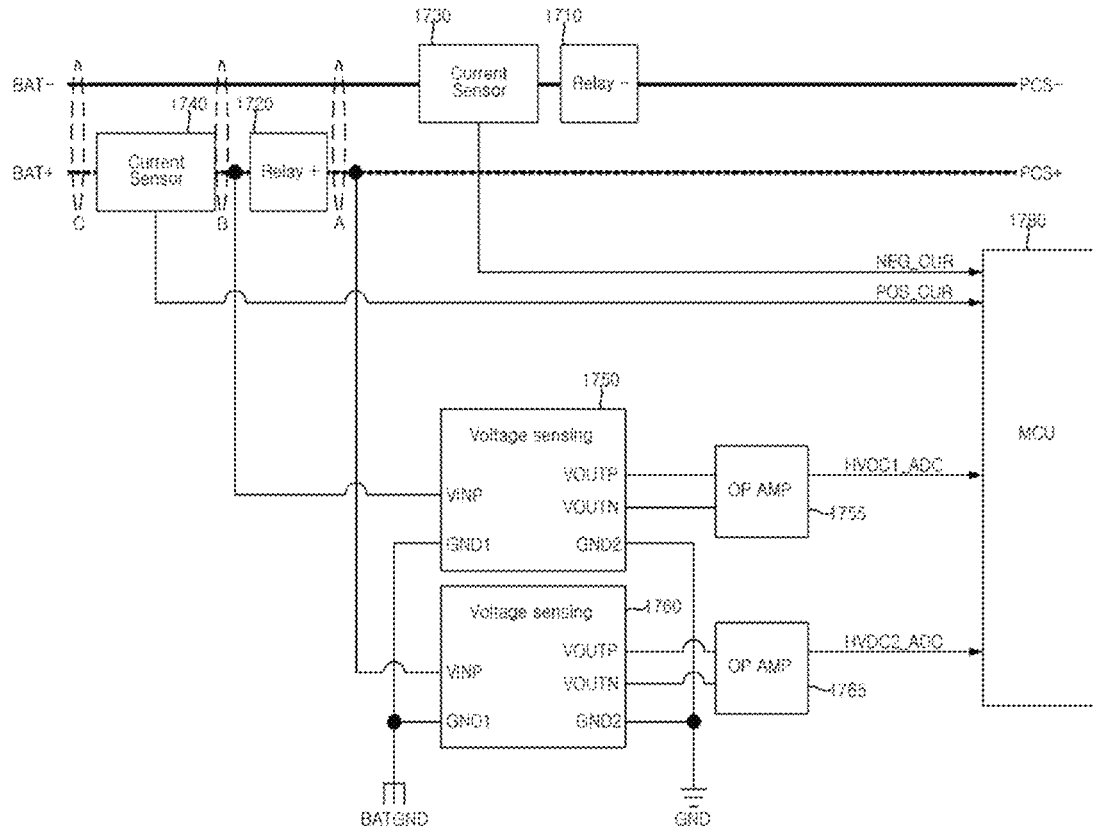
FIG. 17 is a circuit block diagram of a battery management system according to an embodiment of the present disclosure.
FIG. 18 is a diagram illustrating a relay failure diagnosis according to an embodiment of the present disclosure.

FIG. 17 is a circuit block diagram of a battery management system according to an embodiment of the present disclosure, and illustrates circuit components related to safety control.

Referring to FIG. 17, the battery management system 34 may include a first relay (RELAY+) 1720 disposed between the positive electrode (BAT+) of the battery 35 and the positive electrode (PCS+) of the power conditioning system 32, and a second relay (RELAY−) 1710 disposed between the negative electrode (BAT−) of the battery 35 and the negative electrode (PCS−) of the power conditioning system 32. As two relays 1710 and 1720 are provided, even when a problem occurs in either one of the relays, safety control for protecting the remaining circuit can be performed without error by turning off at least one of the relays 1710 and 1720.

The battery management system 34 may include a first voltage sensor 1760 for detecting the voltage of a first node A between the first relay 1720 and the positive electrode (PCS+) of the power conditioning system 32, and a second voltage sensor 1750 for detecting the voltage of a second node B between the first relay 1720 and the positive electrode (BAT+) of the battery 35.

When the voltage of the first node A is equal to or greater than a reference value, the first and second relays 1720 and 1710 may be turned off, and when the voltage of the first node A is less than the reference value, the first and second relays 1720 and 1710 may be turned on.

Accordingly, an overvoltage reference value for determining an overvoltage may be set, and the microcomputer unit 1780 may turn off both the first and second relays 1720 and 1710, when the voltage of the first node A is equal to or greater than the reference value, thereby safely blocking an overvoltage.

Even if one of the voltage sensors 1750 and 1760 fails, the other voltage senor may detect the voltage of a corresponding node. Accordingly, the microcomputer unit 1780 may perform safety control to turn off the relays 1720 and 1710 according to whether the overvoltage reference value set in each node A, B is reached.

The battery management system 34 may include a microcomputer unit 1780 that controls the overall operation. The microcomputer unit 1780 may control a first relay 1720 and a second relay 1710, based on the voltage data detected by the first voltage sensor 1760 and the second voltage sensor 1750.

OP AMPs 1755 and 1765 for signal amplification may be disposed between the microcomputer unit 1780 and the voltage sensors 1750 and 1760.

The first relay 1720, the second relay 1710, the first voltage sensor 1760, the second voltage sensor 1750, and the microcomputer unit 1750 may be mounted in the main circuit board 34a.

The battery management system 34 may further include a first current sensor 1740 disposed between the positive electrode (BAT+) of the battery 35 and the positive electrode (PCS+) of the power conditioning system 32, and a second current sensor 1730 disposed between the negative electrode (BAT−) of the battery 35 and the negative electrode (PCS−) of the power conditioning system 32. The current sensors 1740 and 1730 may measure the amount of current at the respective line. Accordingly, even if any one of the current sensors 1730 and 1740 fails, the other current sensor may detect the current flowing in a corresponding line, so that the microcomputer 1780 can perform safety control.

FIG. 18 is a diagram illustrating a relay failure diagnosis according to an embodiment of the present disclosure. FIG. 18 shows, in a form of a table), examples of determination (State, Note) according to the voltage (relay OUT) sensed in (or at) the first node A and the voltage (relay IN) sensed in (or at) the second node B, when the first relay 1720 is operated.

Referring to FIG. 18, the microcomputer 1780 may detect a fault when an overvoltage greater than or equal to an overvoltage reference value (e.g., 500V, 460V) is generated in (or at) a first mode A.

Referring to FIG. 18, when the microcomputer unit 1780 turns off the first relay 1720, if the voltage (relay OUT) of the first node A is high, it can be determined that the first relay 1720 is faulty.

In addition, when the microcomputer unit 1780 turns on the first relay 1720, if the voltage of the first node A is low, it can be determined that the first relay 1720 is faulty.

When the first relay 1720 is turned off, a voltage should be generated only in (or at) the second node B. Therefore, if a voltage is generated in (or at) the first node A, it may be determined that there is a relay failure.

When the first relay 1720 is turned off so that a voltage is generated only in (or at) the second node B and no voltage is generated in (or at) the first node A, it can be determined that there is a normal operation of the relay.

When the first relay 1720 is turned on, if voltages are generated in (or at) both the first and second nodes A and B, it can be determined that there is a normal operation of the relay.

When the first relay 1720 is turned on, voltage should be generated in (or at) both the first and second nodes A and B, but if voltage is generated only in (or at) the second node B, it may be determined that there is a relay failure.

According to an embodiment of the present disclosure, when the second node B is low, the microcomputer unit 1780 may determine that there is a problem in the rear end C, and generate a fault. Meanwhile, the output voltage C of the battery 35 may be sensed and transmitted by the battery pack circuit board 220, or may be sensed in (or at) the power input terminal of the main circuit board 34a.

According to an embodiment of the present disclosure, the microcomputer unit 1780 may control the first relay 1720 and the second relay 1710 based on voltage data detected by the first voltage sensor 1760 and the second voltage sensor 1750, and voltage data received from the battery pack circuit boards 220.

According to an embodiment of the present disclosure, when the sensing data of the voltage sensor 1760, 1750 and the current sensor 1740, 1730 deviates from a set normal range, the first and second relays 1720 and 1710 for product protection are turned off to block the power line.

According to an embodiment of the present disclosure, in a state (or situation) in which the power line is blocked, after checking the safety state through voltage sensing of the nodes A, B, C, the first and second relays 1720 and 1710 are turned on again to perform automatic recovery.

Figure 19:
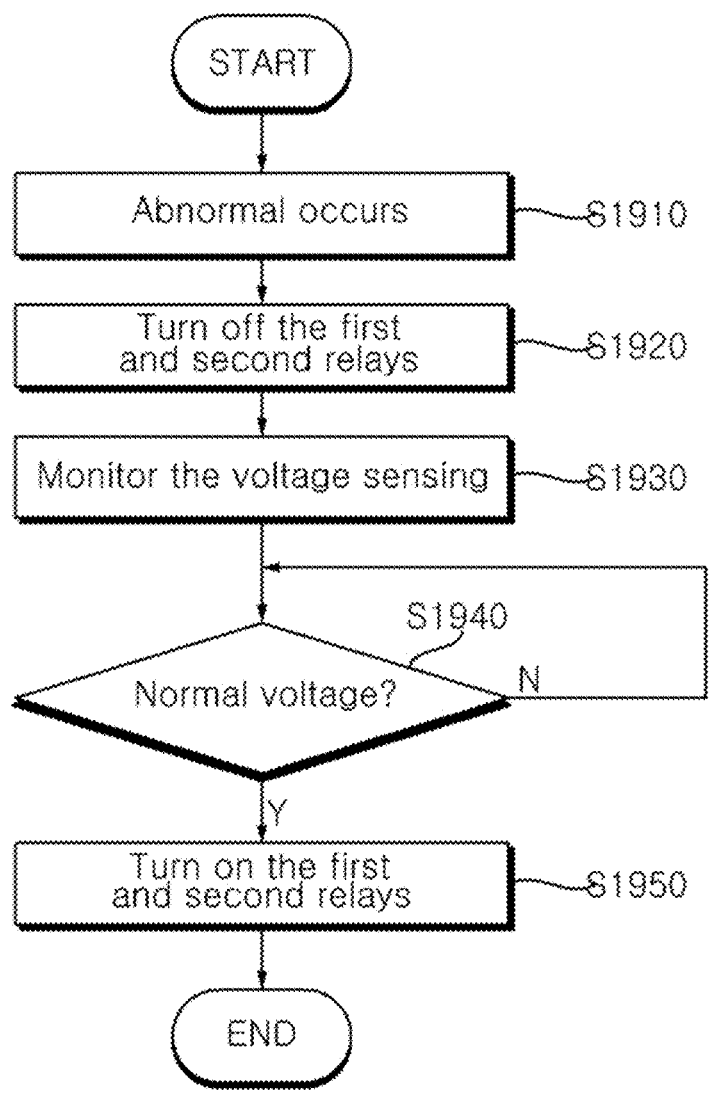
FIG. 19 is a flowchart illustrating a method of operating a battery management system according to an embodiment of the present disclosure.

FIG. 19 is a flowchart illustrating a method of operating a battery management system according to an embodiment of the present disclosure.

Referring to FIG. 19, when an abnormal situation such as overcurrent (or short circuit) or overvoltage occurs (S1910), as a protection operation, the microcomputer unit 1780 turns off the first and second relays 1720 and 1710 (S1920). For example, when the data sensed by the sensors 1730, 1740, 1750, and 1760 deviate from a set normal range (S1910), the first and second relays 1720 and 1710 are turned off to block the power line so as to protect the system (S1920).

The microcomputer unit 1780 monitors the voltage detected by the first and second voltage sensors 1760 and 1750 (S1930).

The microcomputer 1780 may monitor the stable state of an external factor (S1930), and if there is no problem (S1940), may turn on the first and second relays 1720 and 1710 again. This is a function where the system automatically recovers when a failure occurs due to a temporary short circuit or overvoltage, without requiring a service request for (or to return to) normal operation. Accordingly, when the instantaneous error is resolved, the energy storage system 1 may automatically recover to return to normal operation without requiring a worker to be dispatched to directly operate the system.

Figure 20:
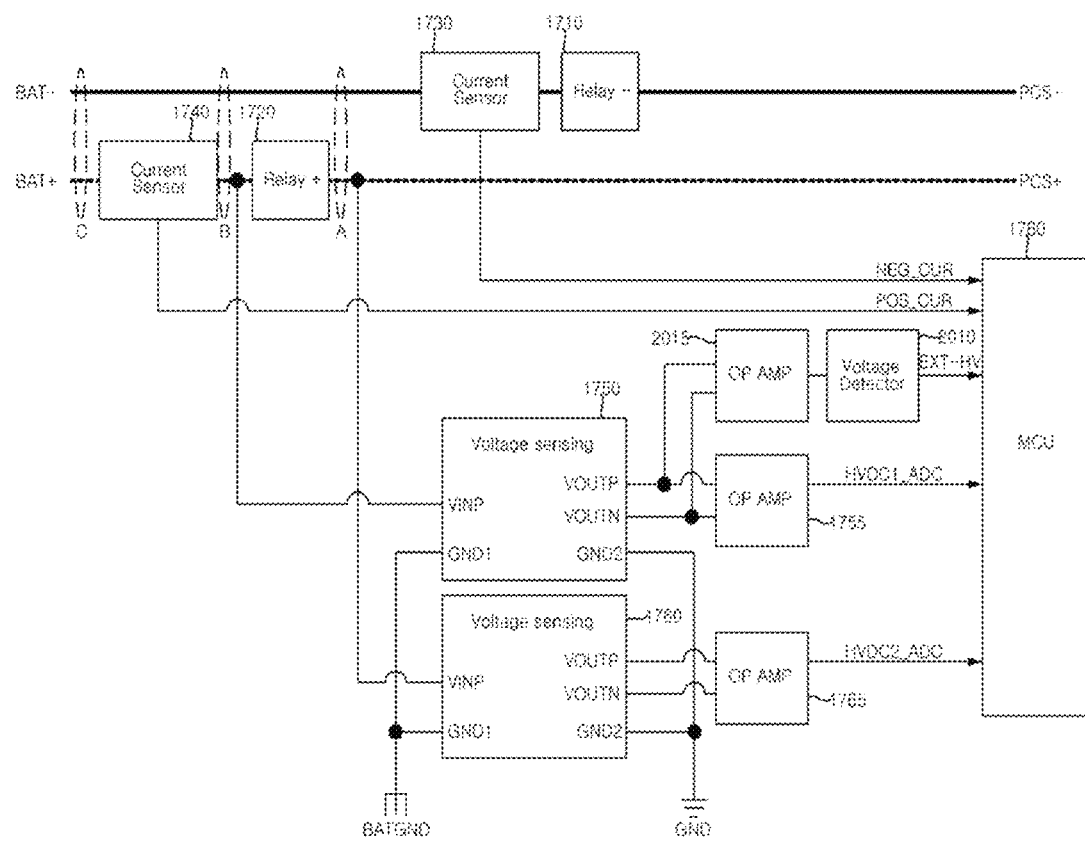
FIG. 20 is a circuit block diagram of a battery management system according to an embodiment of the present disclosure.

FIG. 20 is a circuit block diagram of a battery management system according to an embodiment of the present disclosure. In FIG. 20, an additional safety design is added to the embodiment described earlier with reference to FIG. 17, and differences with respect to FIG. 17 will be mainly (or primarily) described below.

FIG. 20 is a structure that enhances safety by adding a fast responsive safety device, and the battery management system 34 may further include a voltage detector 2010 in the dual voltage sensing structure 1750, 1760 of FIG. 17.

The battery management system 34 further includes a voltage detector 2010 disposed between the second voltage sensor 1750 and the microcomputer unit 1780, and the output of the voltage detector 2010 may be connected to an external interrupt pin of the microcomputer unit 1780. When a certain signal is input to the external interrupt pin, the first and second relays 1720 and 1710 may be turned off.

The voltage detector 2010 is connected to one pin of the microcomputer unit 1780, and the pin which is connected to the voltage detector 2010 is used as an external interrupt pin that does not require a determination to be made (or processed) at the microcomputer unit 1780.

A hardware (HW) voltage sensing structure is added by using a pin which is connected to the voltage detector 2010, thereby providing a faster response compared to the delay time due to the processing by an error generating software (SW).

The external interrupt pin is a pin capable of determining an error when the microcomputer unit 1780 is rebooted. For example, the default state of the external interrupt pin is high, and a low signal is input when overvoltage occurs. When a low signal is input to the external interrupt pin, software failure determination may be omitted, and the first and second relays 1720 and 1710 may be turned off immediately.

An OP AMP 2015 for signal amplification may be disposed between the microcomputer unit 1780 and the voltage detector 2010.

Figure 21:
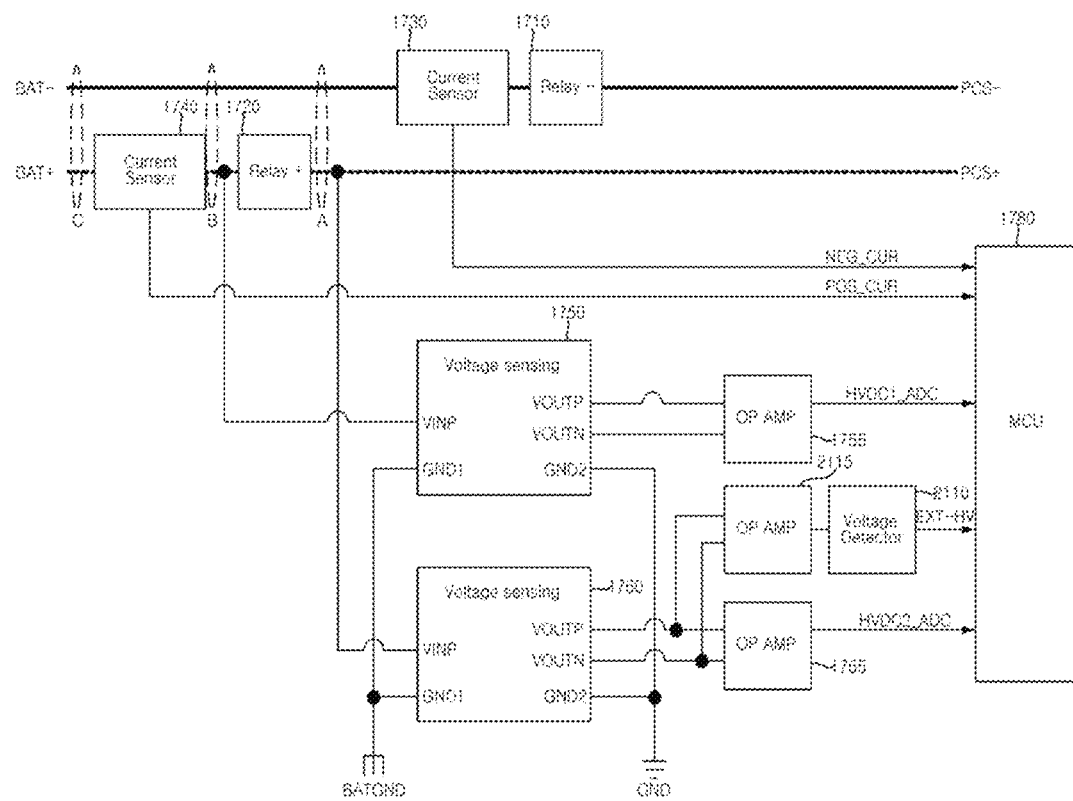
FIG. 21 is a circuit block diagram of a battery management system according to an embodiment of the present disclosure.

FIG. 21 is a circuit block diagram of a battery management system according to an embodiment of the present disclosure, and the battery management system 34 may further include a voltage detector 2110 in the dual voltage sensing structure 1750 and 1760 of FIG. 17.

The battery management system 34 further includes a voltage detector 2010 disposed between the first voltage sensor 1760 and the microcomputer unit 1780, and the output of the voltage detector 2110 may be connected to an external interrupt pin of the microcomputer unit 1780. When a certain signal is input to the external interrupt pin, the first and second relays 1720 and 1710 may be turned off.

The voltage detector 2010 is connected to one pin of the microcomputer unit 1780, and the pin which is connected to the voltage detector 2010 may be used as an external interrupt pin that does not require a determination to be made (or processed) at the microcomputer unit 1780.

The external interrupt pin is a pin capable of determining an error when the microcomputer unit 1780 is rebooted. When a certain signal is input, the software failure determination is omitted, and the first and second relays 1720 and 1710 may be turned off immediately.

An OP AMP 2115 for signal amplification may be disposed between the microcomputer unit 1780 and the voltage detector 2110.

Figure 22:
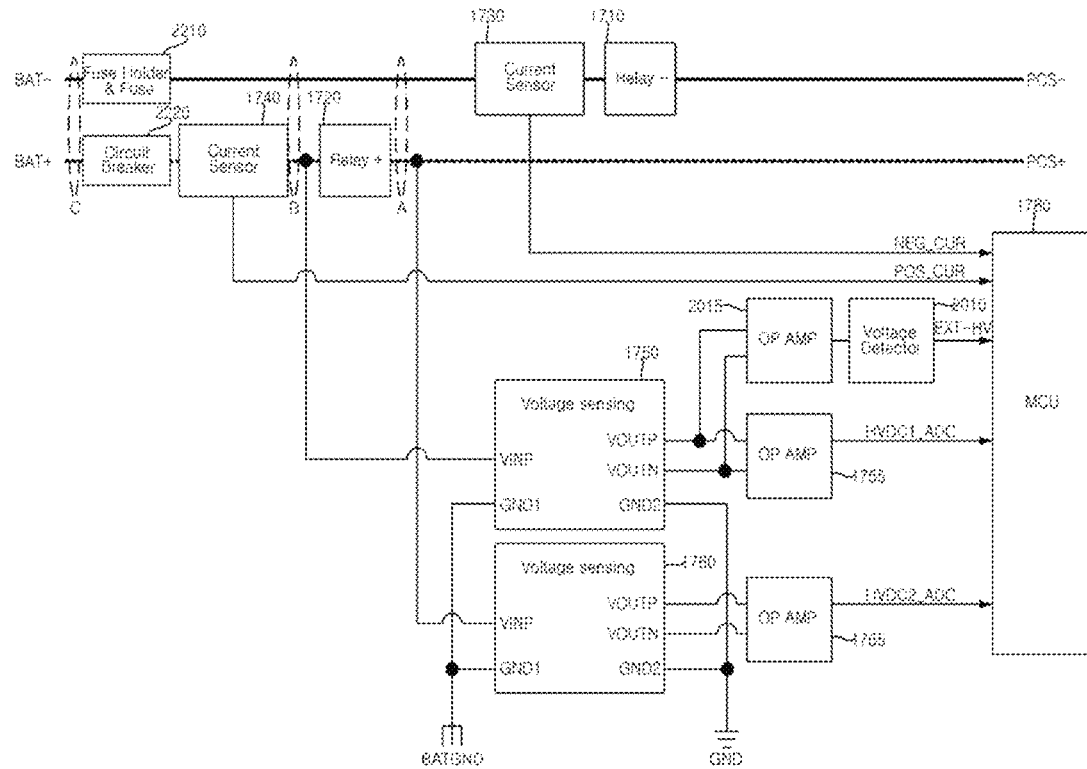
FIG. 22 is a circuit block diagram of a battery management system according to an embodiment of the present disclosure.

FIG. 22 is a circuit block diagram of a battery management system according to an embodiment of the present disclosure. The battery management system 34 may further include a physical safety device 2210, 2220 in the embodiment of FIG. 22.

Referring to FIG. 22, the energy storage system 1 according to an embodiment of the present disclosure may further include a circuit breaker 2220 disposed between the first relay 1720 and the positive electrode (BAT+) of the battery 35. When an overvoltage occurs, the circuit breaker 2220 is turned off, thereby preventing overvoltage.

Referring to FIG. 22, the energy storage system 1 according to an embodiment of the present disclosure may further include a fuse 2210 disposed between the second relay 1710 and the negative electrode (BAT−) of the battery 35. The fuse 2210 is short-circuited when an overcurrent occurs, so that a protection operation can be performed quickly without requiring performance of a software determination process.

Thus, safety can be further improved by adding the overvoltage/overcurrent protection device 2210, 22.

Figure 23:
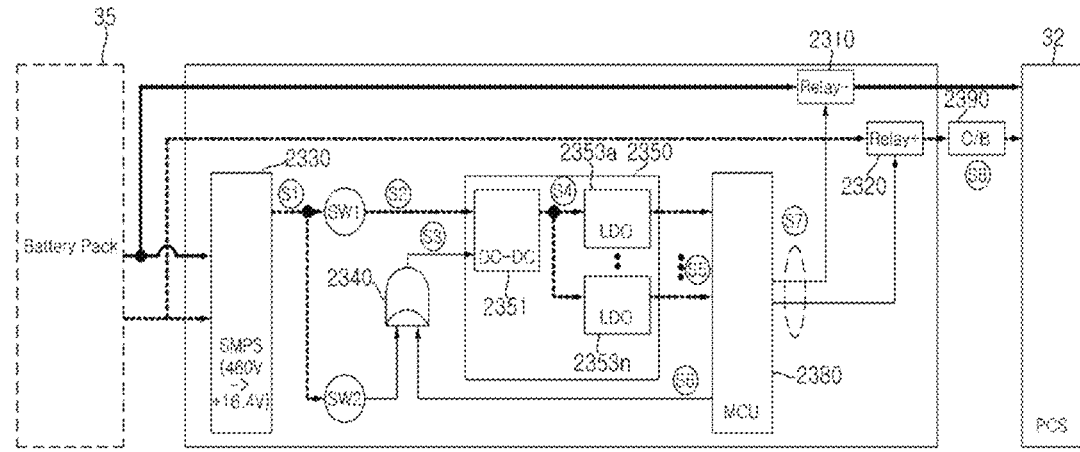
FIG. 23 is a circuit block diagram of a battery management system according to an embodiment of the present disclosure.
Figure 24:
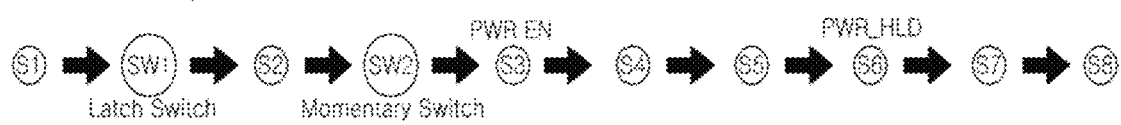
FIG. 24 is a diagram illustrating a power supply sequence according to an embodiment of the present disclosure.

FIG. 23 is a circuit block diagram of a battery management system according to an embodiment of the present disclosure, and illustrates circuit components related to power-on. FIG. 24 is a diagram illustrating a power supply sequence according to an embodiment of the present disclosure.

The energy storage system according to an embodiment of the present disclosure includes a battery 35 that stores the received electrical energy in the form of direct current and/or outputs the stored electrical energy, a power conditioning system 32 that converts an electrical characteristic to charge or discharge the battery 35, and a battery management system 34 for monitoring the state information of the battery 35. When there is a plurality of preset inputs to the battery management system 34 (e.g., based on a plurality of preset inputs being input to the battery management system 34), power is supplied to the power conditioning system 32, and when there is one preset input to the battery management system 34 (e.g., based on a single preset input being input to the battery management system 34), the power supply to the power conditioning system 32 is blocked. That is, power-on may be performed in multi-step, and power-off may be performed in one step.

Referring to FIG. 23, an output of the battery 35 may be connected to a power supply 2330 for supplying driving voltage to internal components of the battery management system 34. The power supply 2330 may be a switching mode power supply (SMPS) that outputs a dropped input voltage.

In the battery 35, a plurality of battery packs 10 may be connected in series. For example, four battery packs 10 may be connected in series to output a DC voltage of 300 to 500V. In FIG. 23, the battery 35 may output a 360V DC voltage, and the power supply 2330 may output 16.4V DC voltage to the power switches SW1 and SW2 (S1).

According to an embodiment of the present disclosure, if there is a plurality of preset inputs to the battery management system 34, power is supplied to the power conditioning system 23, and if there is one preset input to the battery management system 34, the power supply to the power conditioning system 32 is blocked.

That is, for safety purposes, power-on may be performed in multi-step. For safety purposes, power off may be performed in one step.

A step related to power on/off may be performed by operating the switches SW1 and SW2. The energy storage system 1 according to an embodiment of the present disclosure may include a plurality of power switches SW1 and SW2.

Figure 25:
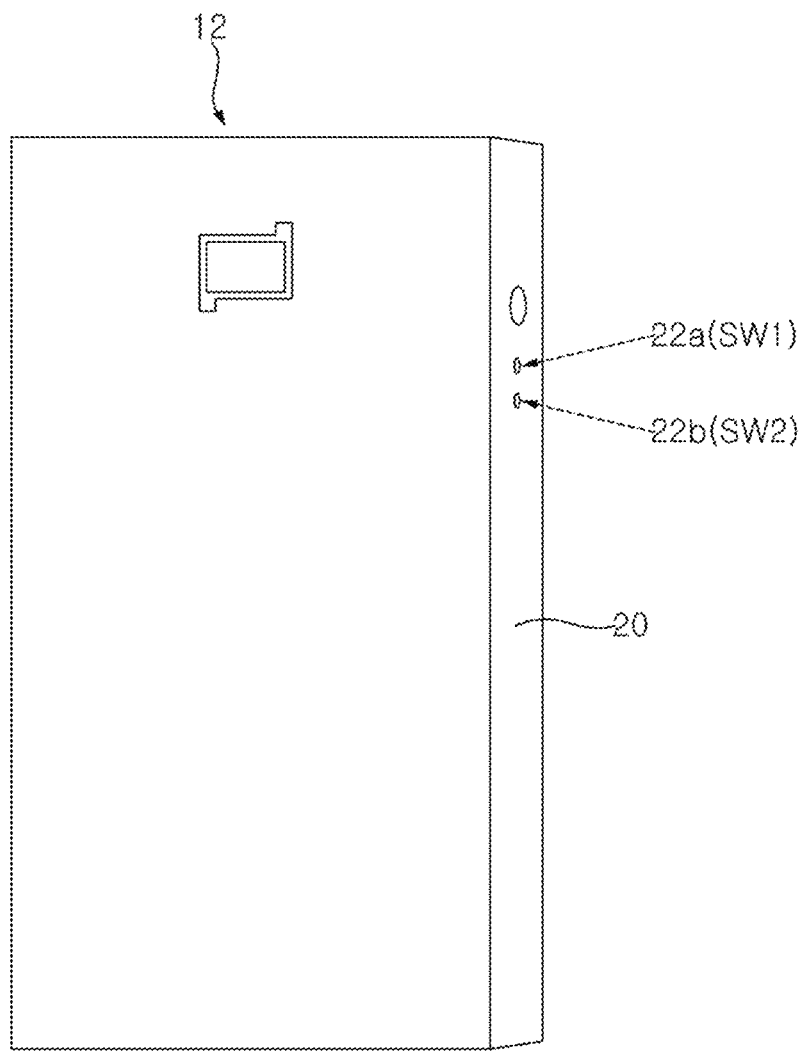
FIG. 25 is a diagram illustrating a power switch according to an embodiment of the present disclosure.
Figure 26:
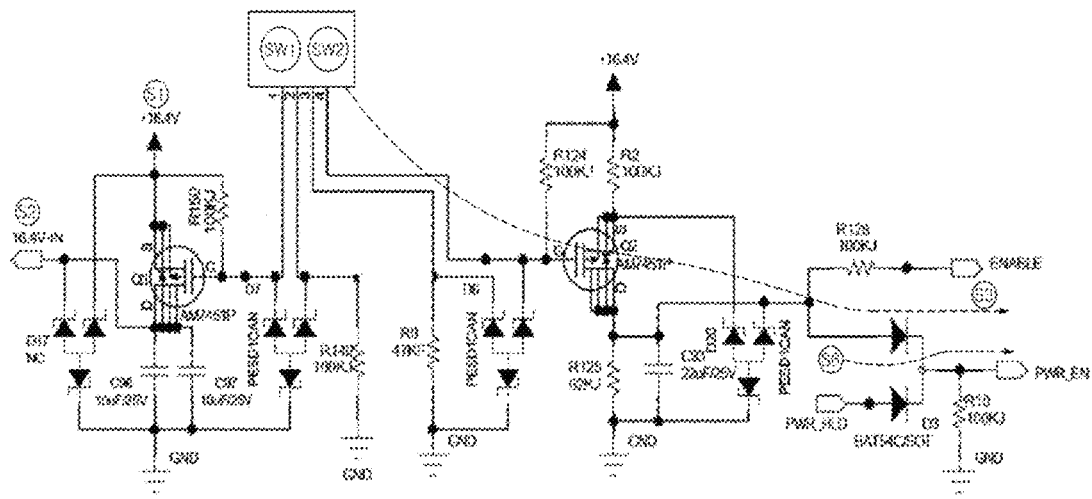
FIGS. 26, 27, 28A, and 28B illustrate implementation examples of the circuit block diagram of FIG. 23.
Figure 27:
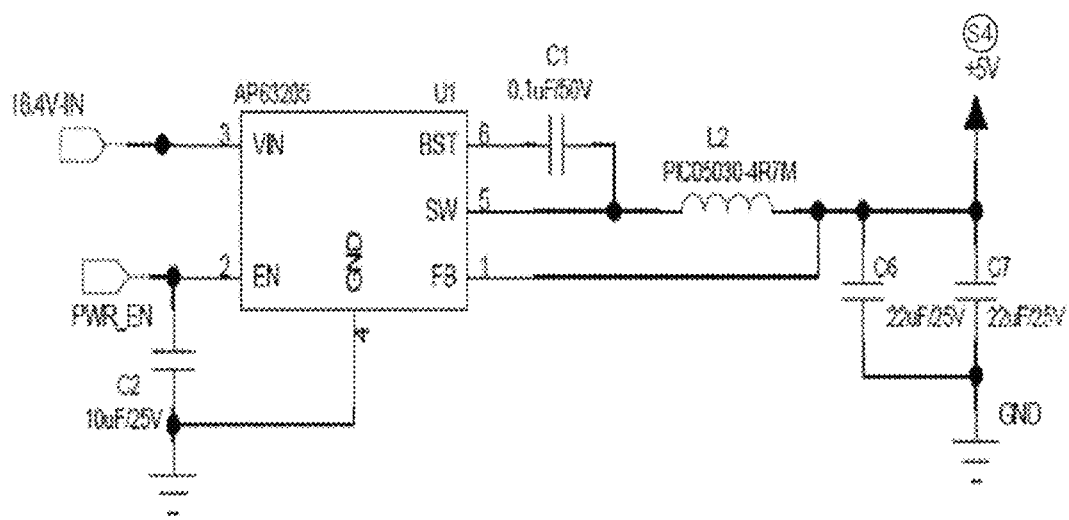
Figure 28A:
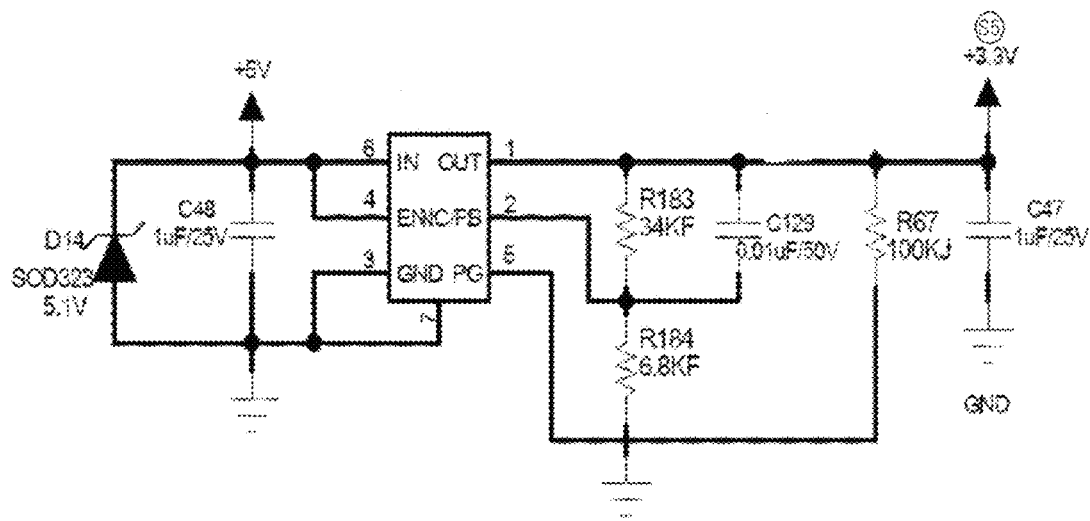
Figure 28B:
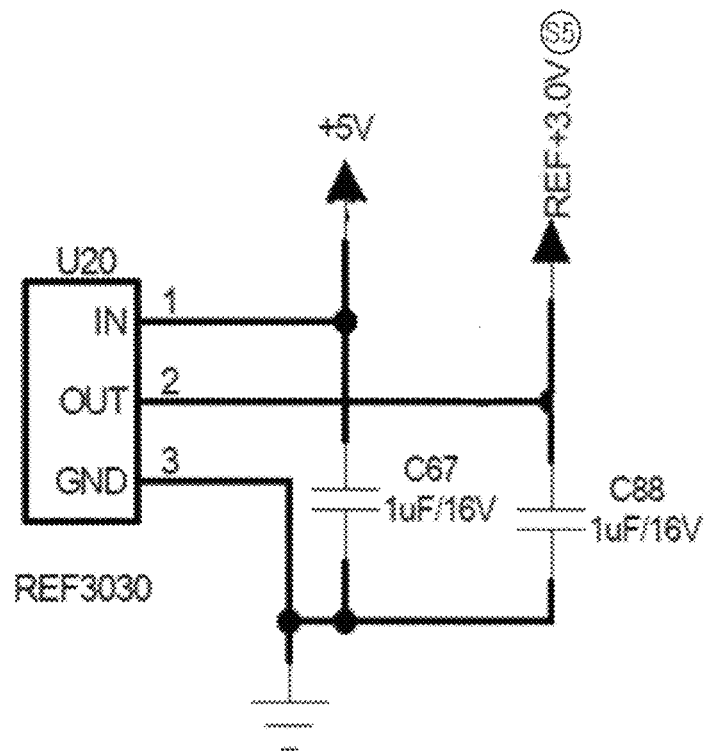

FIG. 25 is a diagram illustrating power switches according to an embodiment of the present disclosure. Referring to FIG. 25, a plurality of power switches 22a (SW1), 22b (SW2) may be disposed at a side wall 20 of the casing 12 forming a space in which the battery 35, the battery management system 34, and the power conditioning system 32 are disposed.

The plurality of preset inputs for power-on may be input by sequentially pressing the plurality of switches SW1 and SW2 one by one. In addition, the one preset input for power-off may be input by pressing any one of the plurality of switches SW1 and SW2 (e.g., by pressing SW1, or by pressing SW2).

In relation to power control design in many electronic products, power is usually designed to be turned on/off through one button (Single Power control). However, since the energy storage system 1 has a risk of accidents such as fire, safety design is more important than such other products. If the single power-on button is pressed due to a carelessness of an installer or a customer, safety issues such as a short-circuit may occur.

According to an embodiment of the present disclosure, by designing the power control design of the battery management system 34 in multi-step, the safety of the installer and the customer may be secured and the battery management system 34 may be prevented from damage by an external surge or a noise. Accordingly, safety can be further enhanced.

According to an embodiment of the present disclosure, in the case of power-on, unintentional power-on due to carelessness may be prevented via multi-step. In addition, in the case of power off, power can be configured to be turned off immediately when a dangerous situation occurs with a one-step control design.

According to a particular embodiment, the plurality of power switches SW1, SW2 are configured as switches having different characteristics, thereby primarily preventing the customer's careless or unintentional unstable power supply, and guaranteeing a stable operation of the battery management system 34 circuit.

Accordingly, it is possible to prevent damage to the battery management system 34 circuit from an instantaneous surge or an instability of power level during a one-button power-on system operation.

The plurality of power switches SW1 and SW2 may include a latch type switch SW1 and a momentary type switch SW2. In this case, the plurality of preset inputs for power-on may be accomplished (or input) by pressing the momentary type switch SW2 after pressing the latch type switch SW1. Since the momentary type switch SW2 must be pressed for a certain time (e.g., 3 seconds), safety can be further enhanced.

The single preset input for power-off may be input by pressing the latch-type switch SW1 again. Accordingly, the power can be turned off more quickly.

Referring to FIG. 23, the battery management system 32 may include a first relay (RELAY+) 2320 disposed between the positive electrode (BAT+) of the battery 35 and the positive electrode (PCS+) of the power conditioning system 32, and a second relay (RELAY−) 2310 disposed between the negative electrode (BAT−) of the battery 35 and the negative electrode (PCS−) of the power conditioning system 32. As two relays 2310 and 2320 are provided, even when a problem occurs in either one, at least one of the relays 2310 and 2320 may be turned off, thereby performing a safety control of protecting the remaining circuit without error.

In addition, the battery management system 32 may include a microcomputer unit (or microcomputer) 2380 that controls the first relay 2320 and the second relay 2310.

The microcomputer unit 2380 may turn on/off the first relay 2320 and the second relay 2310 based on inputs of the plurality of power switches SW1 and SW2.

The plurality of power switches SW1 and SW2 may correspond to the first switch SW1 and the second switch SW2 disposed in (or at) the side wall 20 of the casing 12.

A plurality of preset inputs for power-on may be input by sequentially pressing the first switch SW1 and the second switch SW2 one by one.

Referring to FIG. 23, the battery management system 32 may include a power supply 2330 that converts the output voltage of the battery 35 and outputs it (e.g., the converted voltage) to the first and second switches SW1 and SW2, a microcomputer power driving unit (or microcomputer power driver) 2350 that includes a first input terminal connected (or coupled) to the first switch SW1 and a second input terminal connected (or coupled) to the second switch SW2, and outputs a certain voltage to the microcomputer unit 2380, when there is an input to the first input terminal and the second input terminal, and an OR gate 2340 having input terminals connected (or coupled) to the microcomputer unit 2380 and the second switch SW2, respectively, and an output terminal connected to the second input terminal of the microcomputer power driving unit 2350.

That is, the energy storage system 1 according to an embodiment of the present disclosure includes the battery 35 that stores the received electrical energy in the form of direct current and/or outputs the stored electrical energy, the power conditioning system 32 that converts an electrical characteristic to charge or discharge the battery 35, and the battery management system 34 including the first relay 2320 disposed between the positive electrode of the battery 35 and the positive electrode of the power conditioning system 32, the second relay 2310 disposed between the negative electrode of the battery 35 and the negative electrode of the power conditioning system 32, the microcomputer unit 2380 for controlling the first relay 2320 and the second relay 2310, the power supply 2330 for converting and outputting the output voltage of the battery 35, the first switch SW1 and the second switch SW2 connected to the output of the power supply 2330, the first input terminal (of the microcomputer power driving unit 2350) connected to the first switch SW1 and the second input terminal (of the microcomputer power driving unit 2350) connected to the second switch SW2, the microcomputer power driving unit 2350 for outputting a certain voltage to the microcomputer unit 2380 when there is an input to the first input terminal and the second input terminal, and an OR gate 2340 having input terminals connected to the microcomputer unit 2380 and the second switch SW2, respectively, and an output terminal connected to the second input terminal (of the microcomputer power driving unit 2350).

The microcomputer power driving unit 2350 includes a DC/DC converter 2351 connected (or coupled) to the first input terminal and the second input terminal. In addition, the microcomputer power driving unit 2350 may further include a linear regulator 2353a . . . 2353n connected to the output of the DC/DC converter 2351. The linear regulator 2353a . . . 2353n may be a low dropout (LDO) that operates even in a low input/output potential difference.

The DC/DC converter 2351 may output a first voltage to the linear regulator 2353a . . . 2353n, when there is an input to the first input terminal and the second input terminal, and the linear regulator 2353a . . . 2353n) may output a second voltage to the microcomputer unit 2380 when the first voltage is input. The second voltage may be lower than the first voltage.

When the first switch SW1 is pressed (S1), the 10V to 20V (e.g., 12V, 16.4V) output of the power supply 2330 is supplied to the DC/DC converter 2351 (S2). Thereafter, when the second switch SW2 is pressed for a certain time (e.g., 3 seconds) or longer, the OR gate 2340 outputs a high signal (S3). The output signal of the OR gate 2340 is a control signal of the DC/DC converter 2351, and opens a control path.

When the output of the power supply 2330 is inputted through the first input terminal (S2), and when a high signal of the OR gate 2340 is inputted through the second input terminal (S3), the microcomputer power driving unit 2350 supplies power to the microcomputer unit 2380 (S7).

The microcomputer 2380 turns on the relays 2310 and 2320 (S7), so that the battery voltage is supplied to the power conditioning system 32, thereby completing a power-on sequence (S7).

In an embodiment in which the microcomputer power driving unit 2350 further includes the linear regulator 2353a . . . 2353n, when the power supply 2330 output is inputted through the first input terminal (S2), and when the high signal of the OR gate 2340 is inputted through the second input terminal (S3), the DC/DC converter 2351 supplies power to the linear regulator 2353*a* . . . 2353*n* (S7).

The linear regulator 2353*a* . . . 2353*n* supplies power to the microcomputer unit 2380 (S5), and the microcomputer unit 2380 turns on the relays 2310 and 2320 (S7), so that the battery voltage is supplied to the power conditioning system 32, thereby completing a power-on sequence.

The energy storage system 1 according to an embodiment of the present disclosure may further include a circuit breaker 2390 disposed between the first relay 2320 and the power conditioning system 32. In this case, the battery voltage may be supplied to the power conditioning system 32 after the circuit breaker 2390 is turned on (S8). Accordingly, a multi-safety design can be implemented.

The microcomputer unit 2380 outputs a hold signal to the OR gate 2340 when there is an input from the microcomputer power driving unit 2350 (S6). Accordingly, the OR gate 2340 may continuously output a high signal, and thus the microcomputer power driving unit 2350 may maintain the current state even when a push (or pressing) of the second switch SW2 is finished.

According to an embodiment of the present disclosure, safety may be enhanced by applying a plurality of power switches SW1 and SW2 to the battery management system 34 to implement the power-on sequence in multi-step. It is possible to avoid a circuit malfunction due to an instantaneous inrush current or a surge from the battery 35 to the battery management system 34 circuit during power-on. Two power control physical switches 22*a* and 22*b* may be disposed outside the casing 12 of the battery management system 34.

FIGS. 26, 27, 28A, and 28B illustrate implementation examples of the circuit block diagram of FIG. 23. Hereinafter, embodiments of the present disclosure will be described in detail with reference to FIGS. 23 to 28B.

Referring to the drawings, the power from the battery 35 is input to the SMPS 2330 block inside the battery management system 34, and the output +16.4V that is the output of SMPS 2330 may be input to the first switch SW1 and the second switch SW2 (S1).

When a user presses the first switch SW1 of latch-type, a voltage 16.4V may be primarily input to a DC-DC converter 2351 (S2). At this time, since an enable pin of the DC-DC converter 2351 is not operated, there is no output of the DC-DC converter 2351.

Thereafter, when the user presses the second switch SW2 of the momentary type for a certain time or longer, a control signal is input to the DC-DC converter 2351, thereby turning on an output (S3, S4). The microcomputer power driving unit 2350 may all operate by the output S4 of the DC-DC converter 2351, thereby booting the microcomputer unit 2380 (S5).

Control of the DC-DC converter 2351 may be performed through a hold (PS-HOLD) signal from the microcomputer unit 2380 and the output may be maintained (S6).

After the control enable (S7) of the relay 2310, 2320 of the microcomputer unit 2380, the power conditioning system 32 may be supplied with power by turning on the circuit breaker 2390 (S8).

For safety purposes, Power off can be immediately achieved by pressing only the first switch SW1.

According to an embodiment of the present disclosure, a circuit and a physical button may be implemented so that a multi-step control is performed during the power-on and a one-step control is performed during the power-off.

By stepwise designing the power supply switch of the battery management system 34 using a primary power switch (Self-Lock Latch) and a secondary power switch (Non-Lock Momentary), the stable operation of the circuit part of the battery management system 34 can be enhanced. In particular, it can be implemented such that the main system can operate only when the secondary switch is operated under a certain condition (push for 3 seconds or more) after the primary switch is operated.

In addition, it can be implemented in one step so that the power-off is immediately accomplished at a point of time desired by a customer, or at a time when a safety problem occurs. For example, the power-off may be accomplished by pressing only the primary switch, i.e., the latch switch.

According to at least one embodiment of the present disclosure, a plurality of battery cells and circuits may be stably disposed.

In addition, according to at least one embodiment of the present disclosure, it is possible to protect the control circuit from problems inside the battery pack.

In addition, according to at least one embodiment of the present disclosure, it is possible to secure the safety of the product from short circuit and overvoltage caused by uncontrollable external factors by applying a multi-safety design technology.

In addition, according to at least one embodiment of the present disclosure, it is possible to significantly improve overall safety by providing multiple safety devices.

In addition, according to at least one embodiment of the present disclosure, as a plurality of identical safety devices are provided, even if a problem occurs in any one of the plurality of safety devices, safety control can be performed without an error.

In addition, according to at least one embodiment of the present disclosure, it is possible to accurately determine whether a relay has failed.

In addition, according to at least one embodiment of the present disclosure, when overvoltage or overcurrent occurs, it is possible to provide multiple means for immediately responding in hardware without requiring performance of a software determination process.

In addition, according to at least one embodiment of the present disclosure, in the case of power-on, a multi-step control design may be used to protect the battery management system from instantaneous inrush current from the battery, surge, or the like.

In addition, according to at least one embodiment of the present disclosure, in the case of power off, a one-step control design may be used to immediately turn off when a dangerous situation occurs.

While the present invention has been particularly illustrated and described in detail with reference to exemplary embodiments thereof, it will be understood by those of ordinary skill in the art that various changes in form and detail may be made herein without departing from the spirit and scope of the present invention as defined by the following claims and such modifications and variations should not be understood as being outside the scope of the technical idea or aspect of the present invention.

While the present invention has been particularly shown and described with reference to exemplary embodiments thereof, it will be understood by those of ordinary skill in the art that various changes in form and detail may be made herein without departing from the spirit and scope of the present invention as defined by the following claims and such modifications and variations should not be understood as being outside the scope of the technical idea or aspect of the present invention.

What is claimed is:

1. An energy storage system comprising:
   a battery configured to at least store received electrical energy in a form of direct current, or output the stored electrical energy;
   a power conditioning system configured to convert an electrical characteristic to charge or discharge the battery; and
   a battery management system configured to monitor state information of the battery,
   wherein the battery comprises a plurality of battery packs each comprising a respective plurality of battery cells,
   wherein the battery management system comprises:
   battery pack circuit boards which are disposed in each of the plurality of battery packs, and configured to obtain state information of the plurality of battery cells comprised in each battery pack; and
   a main circuit board coupled to the battery pack circuit boards by a communication line, and configured to receive the state information obtained by the battery pack circuit boards from each battery pack,
   wherein each of the battery packs further comprises battery modules to which the plurality of battery cells are connected in series and in parallel,
   wherein the battery modules are electrically connected to each other,
   wherein two of the battery modules are combined to form a battery module assembly, and
   wherein the battery pack circuit boards are disposed at an upper side of the battery module assembly.

2. The energy storage system of claim 1, wherein the plurality of battery packs are connected in series by a power line,
   wherein the power line is coupled to the main circuit board.

3. The energy storage system of claim 1, wherein the battery management system further comprises:
   a first relay disposed between a positive electrode of the battery and a positive electrode of the power conditioning system;
   a second relay disposed between a negative electrode of the battery and a negative electrode of the power conditioning system;
   a first voltage sensor configured to detect a voltage of a first node between the first relay and the power conditioning system;
   a second voltage sensor configured to detect a voltage of a second node between the first relay and the positive electrode of the battery; and
   a microcomputer configured to control the first relay and the second relay, based on the voltage of the first node detected by the first voltage sensor and the voltage of the second node detected by the second voltage sensor.

4. The energy storage system of claim 3, wherein the first relay, the second relay, the first voltage sensor, the second voltage sensor, and the microcomputer are mounted in the main circuit board.

5. The energy storage system of claim 3, wherein the battery management system further comprises:
   a first current sensor disposed between the positive electrode of the battery and the positive electrode of the power conditioning system; and
   a second current sensor disposed between the negative electrode of the battery and the negative electrode of the power conditioning system.

6. The energy storage system of claim 3, wherein the first relay and the second relay are turned off based on the voltage of the first node being greater than or equal to a reference value, and
   wherein the first relay and the second relay are turned on based on the voltage of the first node being less than the reference value.

7. The energy storage system of claim 3, wherein the microcomputer determines that the first relay has failed based on the voltage of the first node being high when the first relay is turned off, and
   wherein the microcomputer determines that the first relay has failed based on the voltage of the first node being low when the first relay is turned on.

8. The energy storage system of claim 3, wherein the battery management system further comprises a voltage detector disposed between the first voltage sensor and the microcomputer,
   wherein an output of the voltage detector is coupled to an external interrupt pin of the microcomputer, and
   wherein based on a certain signal being input to the external interrupt pin, the first relay and the second relay are turned off.

9. The energy storage system of claim 8, further comprising a circuit breaker disposed between the first relay and the positive electrode of the battery.

10. The energy storage system of claim 8, further comprising a fuse disposed between the second relay and the negative electrode of the battery.

11. The energy storage system of claim 3, further comprising a voltage detector disposed between the second voltage sensor and the microcomputer,
    wherein an output of the voltage detector is coupled to an external interrupt pin of the microcomputer, and
    wherein based on a certain signal being input to the external interrupt pin, the first relay and the second relay are turned off.

12. The energy storage system of claim 3, further comprising:
    a circuit breaker disposed between the first relay and the positive electrode of the battery; and
    a fuse disposed between the second relay and the negative electrode of the battery.

13. The energy storage system of claim 3, wherein the microcomputer controls the first relay and the second relay, based on the voltage of the first node detected by the first voltage sensor, the voltage of the second node detected by the second voltage sensor, and voltage data received from the battery pack circuit boards.

14. The energy storage system of claim 1, wherein the state information comprises at least one of current data, voltage data, or temperature data.

15. The energy storage system of claim 1, further comprising a casing forming a space in which the plurality of battery packs are disposed,
    wherein the power conditioning system is disposed inside the casing.

16. The energy storage system of claim 15, further comprising a power management system for controlling the power conditioning system,
    wherein the power management system is disposed in enclosures outside the casing.

17. The energy storage system of claim 16, wherein an auto transfer switch is disposed in the enclosures, wherein the auto transfer switch is coupled to a grid power supply and a photovoltaic power supply, and is switchable so that, when a power outage occurs in a grid, electric energy produced from the photovoltaic power supply or stored in the battery is supplied to a certain load.

18. The energy storage system of claim 17, wherein the power management system is coupled to the grid power supply and the photovoltaic power supply, and configured to control the electric energy produced by the photovoltaic power supply or stored in the battery to be supplied to the certain load based on the power outage occurring in the grid.

\* \* \* \* \*